United States Patent
Hetherington et al.

(10) Patent No.: US 9,081,066 B2
(45) Date of Patent: Jul. 14, 2015

(54) METHOD AND APPARATUS FOR GENERATING AN EFFECTIVE EQUIVALENT OF SIMULTANEOUS TRANSMISSION TO A TARGETED TISSUE USING A CONVENTIONAL TRANSCEIVER ARRAY

(76) Inventors: Hoby P. Hetherington, Woodbridge, CT (US); Jullie W. Pan, Woodbridge, CT (US)

(*) Notice: Subject to any disclaimer, the term of this patent is extended or adjusted under 35 U.S.C. 154(b) by 595 days.

(21) Appl. No.: 13/374,829

(22) Filed: Jan. 17, 2012

(65) Prior Publication Data

US 2012/0223706 A1    Sep. 6, 2012

Related U.S. Application Data

(63) Continuation-in-part of application No. 13/199,074, filed on Aug. 18, 2011, which is a continuation of application No. PCT/US2010/000871, filed on Mar. 24, 2010.

(60) Provisional application No. 61/461,472, filed on Jan. 19, 2011.

(51) Int. Cl.
| | |
|---|---|
| G01V 3/00 | (2006.01) |
| G01R 33/3415 | (2006.01) |
| G01R 33/561 | (2006.01) |
| G01R 33/34 | (2006.01) |
| G01R 33/36 | (2006.01) |
| G01R 33/341 | (2006.01) |
| G01R 33/345 | (2006.01) |
| G01R 33/565 | (2006.01) |

(52) U.S. Cl.
CPC ...... *G01R 33/3415* (2013.01); *G01R 33/34007* (2013.01); *G01R 33/365* (2013.01); *G01R 33/3635* (2013.01); *G01R 33/5612* (2013.01); *G01R 33/341* (2013.01); *G01R 33/3453* (2013.01); *G01R 33/34076* (2013.01); *G01R 33/34084* (2013.01); *G01R 33/3685* (2013.01); *G01R 33/5659* (2013.01)

(58) Field of Classification Search
CPC .................................................. G01R 33/5612
USPC .......................... 324/314, 309, 307, 312, 300
See application file for complete search history.

(56) References Cited

U.S. PATENT DOCUMENTS

| | | | | |
|---|---|---|---|---|
| 7,719,281 | B2* | 5/2010 | Fontius et al. | 324/322 |
| 8,004,280 | B2* | 8/2011 | Nistler et al. | 324/309 |
| 8,390,288 | B2* | 3/2013 | Graesslin et al. | 324/318 |
| 8,482,281 | B2* | 7/2013 | King et al. | 324/309 |
| 8,508,224 | B2* | 8/2013 | Schneider et al. | 324/309 |

* cited by examiner

*Primary Examiner* — Louis Arana
(74) *Attorney, Agent, or Firm* — David Prashker, Esq.

(57) ABSTRACT

The present invention is a method and apparatus for generating an effective equivalent of a simultaneous transmission of excitation signals to a targeted living tissue using an existing MRI system assembly or transceiver apparatus which structurally has a small number of independent transmit channels in operative communication with a large number of individual transmission RF coils. The inventive methodology and apparatus is suitable for use with any conventionally known and used transceiver apparatus which operationally complies with the requisite difference existing between the lesser available numbers of independent transmission channels and the greater number of individual transmit RF coils. For this reason, the methodology is broadly and generally useful for many different applications of magnetic resonance imaging technology.

15 Claims, 6 Drawing Sheets

Fig. 1
Fig. 1A 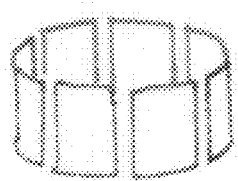 Fig. 1B 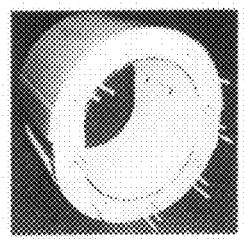 Fig. 1C 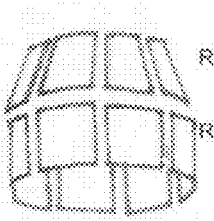 Fig. 1D 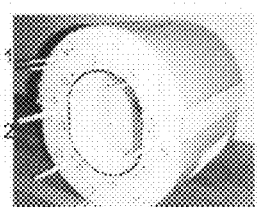
Fig. 2
Fig. 2A 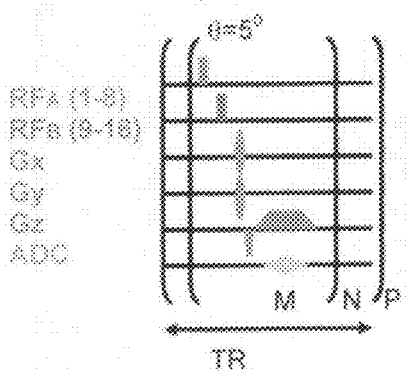 Fig. 2B 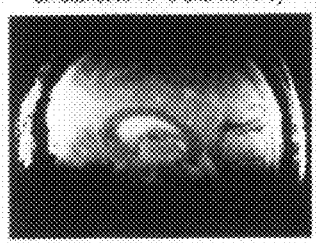 Fig. 2C 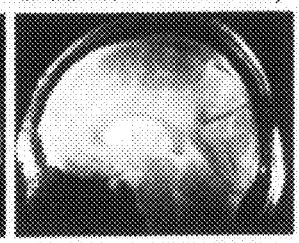

Fig. 3
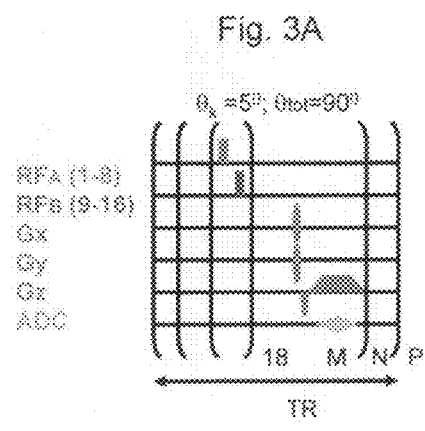
Fig. 3A
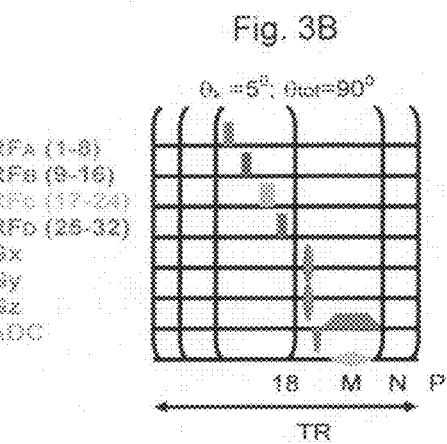
Fig. 3B
Fig. 4
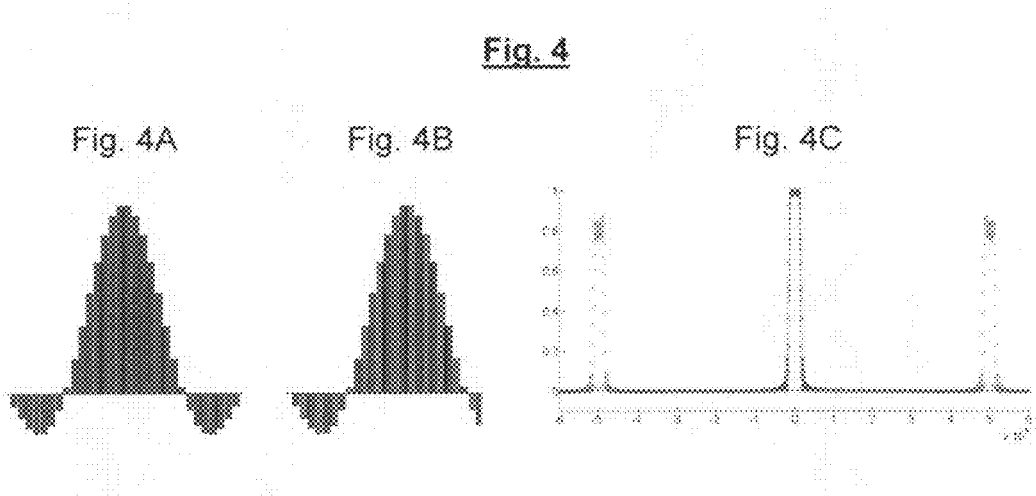
Fig. 4A    Fig. 4B    Fig. 4C

Fig. 5
Fig. 5A
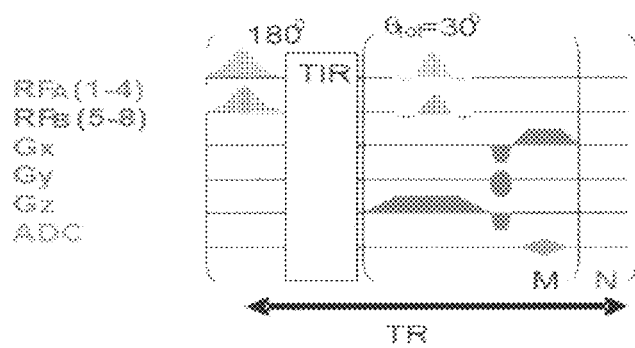
Fig. 5B
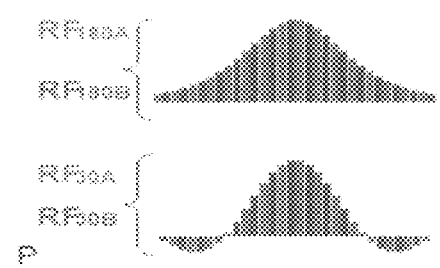
Fig. 5C
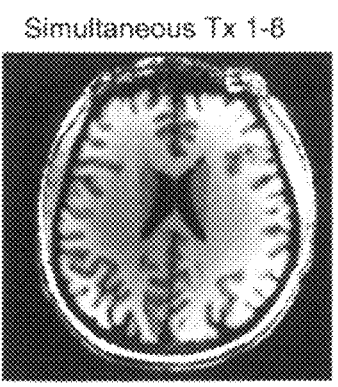
Simultaneous Tx 1-8
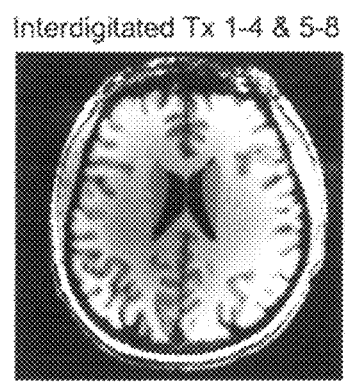
Interdigitated Tx 1-4 & 5-8

Fig. 6
Fig. 6A
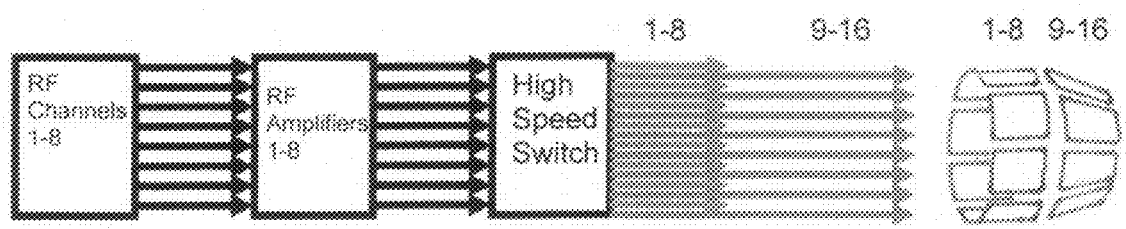
Fig. 6B
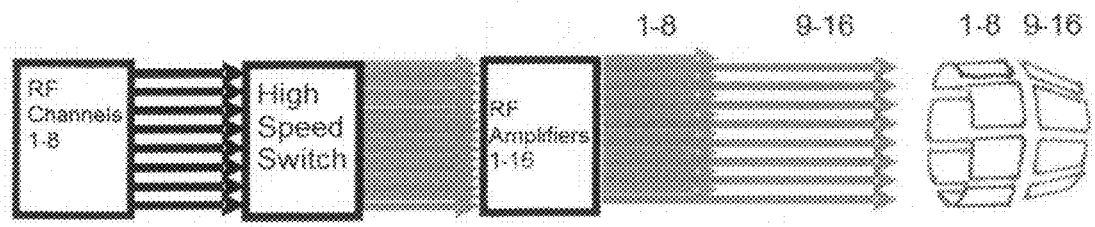

Fig. 7
Fig. 7A 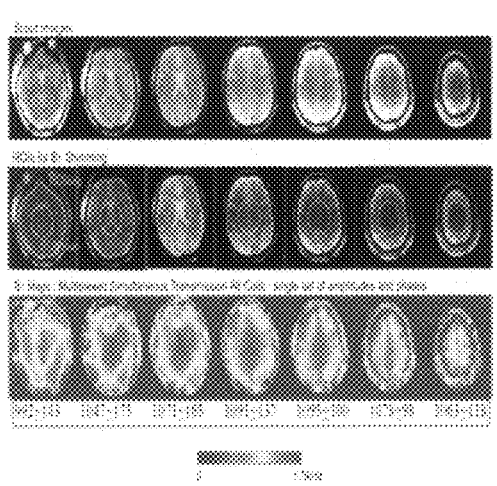 Fig. 7B 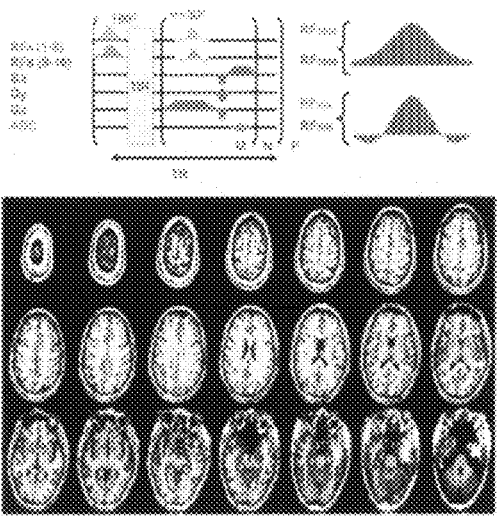
Fig. 7C
Fig. 8
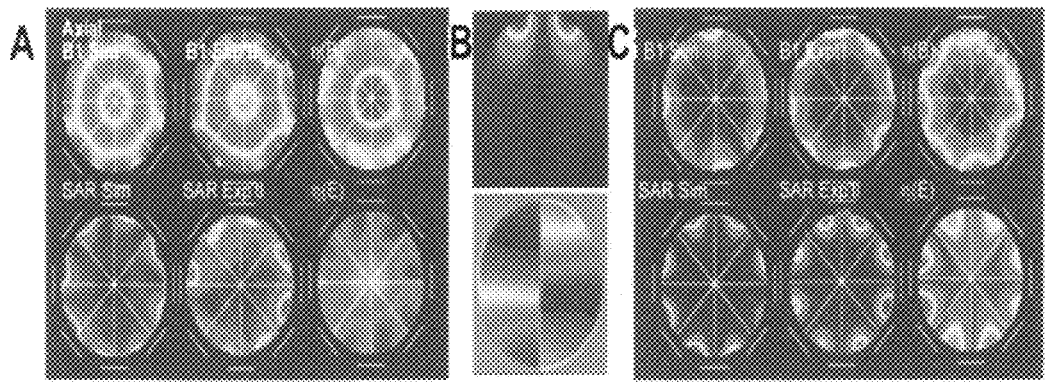

Fig. 9
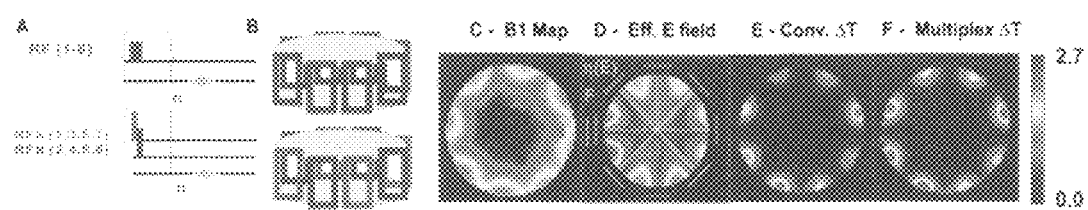
Fig. 10
Fig. 10A  Fig. 10B  Fig. 10C
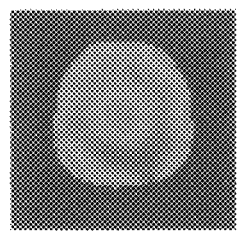 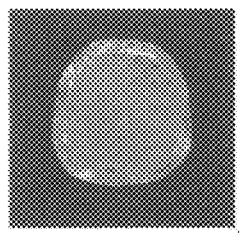 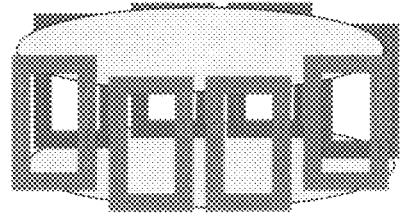
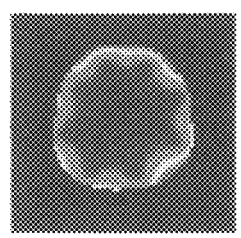 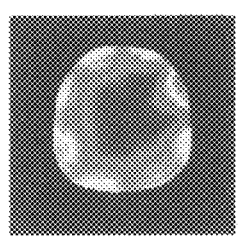 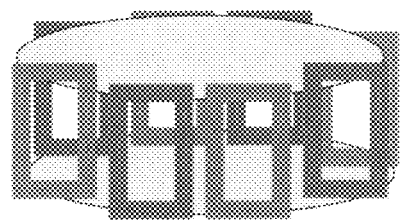
Fig. 10D  Fig. 10E  Fig. 10F

METHOD AND APPARATUS FOR GENERATING AN EFFECTIVE EQUIVALENT OF SIMULTANEOUS TRANSMISSION TO A TARGETED TISSUE USING A CONVENTIONAL TRANSCEIVER ARRAY

CROSS-REFERENCE

The present application is a Continuation-In-Part of and claims the benefits of co-pending U.S. patent application Ser. No. 13/199,074 filed Aug. 18, 2011 (which is itself a Continuation of International Patent Application No. PCT/US2010/000871 filed on Mar. 24, 2010).

PRIORITY CLAIM

The present invention was first filed with U.S. Patent & Trademark Office on Jan. 19, 2011 as U.S. Provisional Patent Application Ser. No. 61/461,472. The legal benefits and advantages of this first filing are expressly claimed herein.

FIELD OF THE INVENTION

The present invention is concerned generally with improvements in magnetic resonance imaging technology; and is directed specifically to improvements in methods for generating an effective equivalent of a simultaneous transmission of excitation signals to a targeted living tissue using an existing MRI assembly or transceiver apparatus which structurally has a smaller number of independent transmission channels in operative communication with a larger number of individual transmit RF coils.

BACKGROUND OF THE INVENTION

Magnetic resonance imaging ("MRI") has been and continues today to be a valuable clinical diagnostic tool for examination of a wide range of human body systems and physiological processes. Accurate anatomic, functional and biochemical information can be obtained from the data collected; and new medical research and clinical applications continue to be developed as the MRI technology steadily advances and improves. It is also noteworthy that as the technological advances continue to improve achievable spatial resolution of living tissues, increasingly finer anatomic and more precise biochemical details of the living human body are able to be imaged and evaluated using MRI procedures.

Magnetic Resonance Imaging Systems and Assemblies

Operationally, a conventional MRI system establishes a substantially homogenous temporally static magnetic field (commonly referred to as the $B_0$ field) along an axis of a living person's body that is to undergo clinical examination. The $B_0$ field magnetically conditions the interior of the person's body for imaging by causing the nuclear spins of certain nuclei which have a nuclear magnetic movement (e.g., $^1H$, $^{19}F$, $^{13}C$, and $^{31}P$) to align themselves along the axis of the magnetic field.

After being placed in the $B_0$ magnetic field, the nuclear movements of these susceptible atoms can only take up certain discrete orientations, each orientation corresponding to a different energy state. Then, depending upon and varying with the strength of the $B_0$ field and the gyromagnetic ratio ($\gamma$) of the nuclei of interest in the targeted living tissue, the summed net nuclear magnetic moment is determined.

Transition of nuclei between these differing energy levels can be induced by the purposeful application of a second magnetic field—$B_1$ field—whose axis lies at right angles to the generated $B_0$ field. The frequency at which energy is absorbed by the nuclei is termed the resonant frequency; and will vary with the type of nucleus; and is proportional to the $B_0$ (the strength of the magnetic field or flux density). The proper resonant frequency therefore depends upon the magnetic field at the nucleus; which in turn, depends upon the particular environment in which the particular nucleus exists. For example, the protons in water experience the resonance effect in a magnetic field of 7T (Tesla) at a frequency of 298 MHz (Megahertz).

In this manner, the orientation of the net nuclear moment of these nuclear spins in the targeted living tissue can be substantially altered by application of a time-varying magnetic field of a specific frequency, the $B_1$ field—which is oriented perpendicularly to the axis of the pre-existing $B_0$ field. The frequency of the $B_1$ field (i.e., the resonant frequency) is given by $\gamma B_0$, which is typically in the radiofrequency (RF) range of 3 Hz-3 GHz.

The $B_1$ fields are typically introduced as brief time bursts of a wave-like magnetic field which vary in duration from a few micro-seconds to tens of milliseconds; and this $B_1$ magnetic field is routinely generated and applied to the targeted subject as a streaming series of magnetic pulses. Such magnetic pulses are typically generated by passing a series of known electromagnetic waveforms (having a prechosen radiofrequency which is typically the resonance frequency of the nucleus of interest in the targeted subject) as a RF pulse stream through one or more transmit RF coils in a RF array of a conventionally structured MRI assembly or transceiver apparatus; and in which the individual transmit RF coils of the RF array are positioned adjacent to and often completely surround the targeted living tissue or subject. In this manner, a timed series of brief bursts of a wave-like magnetic field (the $B_1$ field) are applied to the targeted subject at a prechosen radiofrequency which excites the nuclei of interest.

The spatial pattern of the $B_1$ magnetic field is determined by the geometry of the transmit RF coil(s) and the combination of the waveform amplitudes and phases of the individual RF pulses forming the stream. By varying the phase and amplitude of the electromagnetic waveforms in the RF pulses provided to each transmit RF coil via their transmit channels or amplifiers, the overall spatial pattern and intensity of the $B_1$ magnetic field applied to a targeted object can be markedly varied. Thus, by making an appropriate choice of waveform phase and amplitude for the individual RF pulses delivered to each transmit RF coil, the transmitted $B_1$ magnetic field can be made more homogeneous; and also be contoured so as to effect, excite, or perturb specified spatial locations within the targeted subject.

Following the introduction of the $B_1$ field to the targeted subject, the nuclei of interest will attempt to regain their previous orientation; and in doing so, the nuclei of interest will concomitantly emit distinctly different radiofrequency signals (i.e., resonance signals) which have a time-varying magnetic field. Thus, as the nuclei relax and regain their previous orientation, their emission signal—a free induction decay ("FID")—is generated. This emission signal, being a free induction decay, is a summation of sinusoidal waveform signals, where each waveform signal is characterized by a sinusoidal shaped wave pattern, a waveform amplitude (measured in volts) and a waveform frequency (measured in Hz). The amplitude is proportional to the concentration of those nuclei in the sample; while the frequency is characteristic of the unique chemical environment of those nuclei of interest.

These emitted FID signals are conventionally detected by a plurality of receiver RF coils in the MRI assembly or transceiver apparatus. Once received, a Fourier transformation of the received FID signals will yield a spectrum plot of data, with multiple peaks (or resonances) resolving the signals from individual nuclei with different chemical environments along a frequency axis. This spectrum plot provides much information about the concentration and structure of the molecules in the targeted subject. For this reason, both spectroscopic data and spectroscopic images are commonly utilized as diagnostic aids and modes of clinical evaluation.

A large variety of different assemblies and a wide range of alternative systems have been developed over time for performing magnetic resonance imaging, and all of these are well established and conventionally known in the technical field. The scope and diversity of these various developments are merely exemplified and represented by U.S. Pat. Nos. 7,573,270; 7,501,823; 7,358,923; 7,358,923; 7,345,485; 7,298,145; 7,285,957; 7,173,425; 7,088,104; 7,088,100; 7,012,429; 6,940,466; 6,853,193; 6,771,070; 6,552,544; 6,538,442; 6,107,798; 6,011,395; 5,998,999; 5,791,648; 5,642,048; 5,610,521; 5,565,779; 5,483,163; 5,483,158; 5,473,252; 5,461,314; 5,365,173; 5,243,286; 5,196,797; 5,185,575; 5,172,061; 5,159,929; 5,081,418; 4,926,125; 4,918,388; 4,885,539; 4,879,516; 4,871,969; 4,820,985; 4,788,503; 4,783,641; 4,780,677; 4,752,736; 4,751,464; 4,737,718; 4,731,584; 4,725,780; 4,721,915; 4,129,822; 4,320,342; and 4,638,253 respectively. The texts and figures of all these U.S. patents are expressly incorporated by reference herein.

A Continuing and Recurring Problem in MRI Technology

Recent advances in magnet technology have enabled the construction of higher field strength magnets for performing magnetic resonance imaging of the human head and body at high magnetic field strengths of 7T and above. However, the use of these high field magnets for clinical applications has been slowed by the severe technical limitations imposed by the transmission/reception systems of transceivers suitable for use with only the low 1.5T (human body) and moderate 3T (head only) magnetic field strengths.

As conventionally performed, the low 1.5T magnetic field strength clinical applications often use one large, single drive, transmission only volume RF coil in combination with multiple, receive only RF coils for homogeneous transmission and high efficiency reception of differing radiofrequency signals. However, when employed at high magnetic field strength applications and frequencies [i.e., 7T-12T (human head) and 3T-6T (human body)], the one large transmit only single drive volume RF coil suffers from poor homogeneity and low efficiency transmissions—owing to the strong interactions between the generated transmission field and the targeted living tissue [see for example, Vaughan et al., "7T vs. 4T: RF power, homogeneity, and signal-to-noise comparison in head images", *Magn. Reson. Med.* 46(1):24-30 (2001)].

Conventionally, the use of RF arrays with large numbers of RF coils requires a dramatic increase in the number of independent transmission and receiver channels—e.g., 24 (8×3) arrays (coils/row×rows). Although 24-32 or more receiver channels are available on many clinical systems, most clinical systems do not support more than 8 independent transmission channels. Moreover, the use of power splitters with fixed phase and amplitude relationships to increase the number of outputs is ineffective, as the optimal phase and amplitude relationships vary depending upon load and the desired $B_1$ distribution.

Thus, increasing the number of transmission channels is costly (up to $125,000 per transmission channel for a Siemens upgrade from 1 to 8 channels). Splitting the power of one RF channel to drive three different RF coils in the RF array is ineffective, as the required phase and amplitude relationships between any pair or group of RF coils will vary depending on their relative positions in the array and loading (both within the same row or across rows). Furthermore, the phase and amplitude relationships between these RF coils can vary within pulse sequences where more than a single $B_1$ spatial distribution is used. Thus, conventional hardware and pulse sequence methods which can be used to mimic large numbers of independent transmission channels may marginally overcome these limitations and can provide "backwards compatibility" with some presently existing systems.

In addition, although many modern MRI systems are typically equipped with a large known number of independent receiver channels which matches the total number of independent RF coils in receive only phased arrays—e.g., 16-32 independent receive channels disposed in a 1:1 ratio direct correspondence with an identical number of receive only RF coils are commonly found on state of art clinical systems—the number of independent transmission channels is typically limited to only one or two, and the actual number of independent transmission channels has no correspondence at all with the existing total number of transmit only RF coils. Consequently, even the most advanced clinical research systems available today typically have at most only 6-8 independent transmission channels in operative correspondence with and in service of from 16-32 individual transmit only RF coils.

Also, with the increases in magnetic field strength, the requirements for peak $B_1$ (to maintain a constant chemical shift-bandwidth ratio) increases linearly, while the efficiency in μT/kW of any given detector design decreases linearly [see for example: Vaughan et al., "7T vs. 4T: RF power, homogeneity, and signal-to-noise comparison in head images", *Magn. Reson. Med.* 46(1):24-30 (2001)]. Thus, the peak power requirements increase as the cube of the chosen magnetic field strength. This, in turn, significantly increases SAR; and thereby limits the number of tissue slices in imaging sequences using spin echoes. Consequently, conventionally used RF coil arrays have come under much scrutiny, since the ability to control the phase and amplitude of each transmit channel can result in unwanted large local increases in SAR due to constructive E field interference.

For these reasons, in order to provide a homogeneous transmission of excitation RF pulses in RF arrays typically requires the purposeful inclusion of discrete additional independent transmission channels to create a 1:1 ratio correspondence and communication linkage between the available number of transmission channels and the existing number of transmit RF coils—an arrangement which is quite costly, technologically complex, and not available in currently used clinical MRI platforms.

Furthermore, an alternative approach—which involves splitting the power of each independent transmission channel to communicate with and serve two or more transmit only RF coils in the RF transmission array—has been shown to be markedly ineffective because the waveform phase and amplitude relationships existing between any two or more independent transmit RF coils will vary considerably (depending on the interactions of the transmit RF coils with the targeted sample or specific body region). Such differences in waveform phase and amplitude relationships between any two or more transmit RF coils effectively destroys $B_1$ field homogeneity and dooms the operative value and intended function of the transmitted RF pulse stream.

It will be noted also that the processes of transmission and reception are directional—i.e., transmission proceeds from transmission channel to RF amplifier, to RF coil, to targeted living sample; while resonance signal reception proceeds from targeted living sample to receive RF coil, to receiver channel, to reception signal recorder.

Accordingly, the recurring problem of how to generate a homogeneous transmission of excitation RF pulses using RF arrays having ever larger numbers of independent transmit RF coils (e.g., 8-32 transmit RF coils) is long known and well recognized. Consequently, any ordinarily skilled practitioner in this art would regard the development of a reliable method that enables a small number of independent transmit channels (typically 2-8) to modulate power deposition and to drive an arbitrarily chosen larger number of independent transmit RF coils then present within a conventional MRI assembly as being both an unforeseen substantial improvement and an unexpected major advance in MRI technology.

SUMMARY OF THE INVENTION

In its broadest scope, the present invention is a unique method for generating an effective equivalent of a simultaneous transmission of excitation RF signals to a targeted living tissue disposed within a moderate to high strength magnetic field for magnetic resonance imaging. In its minimalist form, said method comprises the steps of:

accessing a MRI assembly having means for producing electromagnetic waveforms as a RF excitation pulse stream on-demand and wherein a lesser number of independent transmission channels are in operative communication with a greater number of individual transmit RF coils in an RF array for the conveyance of an RF excitation pulse stream;

producing a RF excitation pulse stream suitable for conveyance by the transmission channels to individual transmit RF coils in the RF array;

splitting said RF excitation pulse stream into not less than two separate and sequentially deliverable RF pulse flows, each of which is to be individually conveyed and delivered in sequential series via the existing number of transmission channels to one of the different designated groupings of multiple transit RF coils within the RF array; and sequentially conveying each of said split RF pulse flows via the existing transmission channels to one of the different designated groupings of multiple transmit RF coils in the RF array for separate and in-series transmissions of $B_1$ field bursts concurrently to a targeted living tissue, whereby an effective equivalent of a true simultaneous transmission of a $B_1$ magnetic field is achieved.

* * *

In contrast, the envisioned scope and coverage of the preferred method comprises the steps of:

accessing a MRI assembly having means for producing electromagnetic waveforms as a RF excitation pulse stream on-demand and wherein a lesser number of independent transmission channels are in operative communication with a greater number of individual transmit RF coils in an RF array for the conveyance of an RF excitation pulse stream;

producing a RF excitation pulse stream suitable for conveyance by the transmission channels to individual transmit RF coils in the RF array;

splitting said RF excitation pulse stream into not less than two separate and sequentially deliverable RF pulse flows, each of which is to be individually conveyed and delivered in sequential series via the existing number of transmission channels to one of the different designated groupings of multiple transit RF coils within the RF array;

altering said split RF pulse flows such that at least one characteristic property of the split RF pulse flow becomes identifiably different, said alteration of at least one characteristic property being at least one action selected from the group consisting of
  (i) temporally concatenating the pulses of the split RF pulse flow,
  (ii) interdigitating the pulses of the RF pulse flow,
  (iii) changing the timing sequence of the pulses in the RF pulse flow, and
  (iv) changing the selectivity of the pulses in the RF pulse flow; and sequentially conveying each of said altered split RF pulse flows via the existing transmission channels to one of the different designated groupings of multiple transmit RF coils in the RF array for separate and in-series transmissions of $B_1$ field bursts concurrently to a targeted living tissue, whereby an effective equivalent of a true simultaneous transmission of a $B_1$ magnetic field is achieved

BRIEF DESCRIPTION OF THE FIGURES

The present method can be more clearly understood and better appreciated when taken in conjunction with the accompanying Drawing, in which:

FIG. 1A is a schematic illustration of 8 coil transceiver array arranged in a single elliptical row of 8 coils;

FIG. 1B is a photograph of actual RF coils arrayed in a transceiver with cosmetic covers in place;

FIG. 1C is a schematic illustration of 16 coil transceiver array, featuring two elliptical rows of 8 coils;

FIG. 1D is a photograph of other RF coils arrayed in a transceiver with cosmetic covers in place;

FIG. 2A illustrates a pulse sequence showing the RF pulse being applied to coils 1-8 (red $RF_A$) and 9-16 (blue $RF_B$) sequentially followed by phase encoding gradients (green Gx, Gy) and a read out gradient (Gz);

FIG. 2B shows a slice from a 3D image acquired using the single row 8 coil transceiver array;

FIG. 2C shows a slice from a 3D image acquired using a 16 coil (two rows of 8 coils each) elliptical transceiver array;

FIG. 3A shows a pulse sequence for 3D image using a 90 degree excitation pulse, constructed by interdigitating 18-5 degree pulses to RF coils 1-8 with pulses to RF coils 9-16;

FIG. 3B shows an equivalent pulse sequence to FIG. 3A, but using 32 transmit coils and interdigitating the pulses to four groups of 8 RF coils each;

FIG. 4A shows a sinc waveform;

FIG. 4B shows a sinc waveform as interdigitated RF, red first group of coils, blue second group of coils;

FIG. 4C is a plot of the transverse magnetization (vertical axis) versus frequency offset (v) for simultaneous excitation for simultaneous excitation (blue line) or interdigitated excitation (red circles) where one group of coils has 0 amplitude;

FIG. 5A is an illustration of a pulse sequence showing the RF pulse being applied to RF coils 1-4 (red $RF_{180A}$, $RF_{30A}$) and RF coils 5-8 (blue $RF_{180B}$, $RF_{30B}$) in an interdigitated fashion followed by a phase encoding gradients (green Gy) and a read out gradient (Gx);

FIG. 5B is an axial image acquired using simultaneous transmission to all 8 RF coils;

FIG. 5C is an axial image acquired using its interdigitated equivalent to all 8 RF coils;

FIG. 6A is a schematic illustration for the use of the 16 channel transceiver array being driven with 8 independent RF channels and RF amplifiers;

FIG. 6B is a schematic illustration for the use of the 16 channel transceiver array being driven with 8 independent RF channels and 16 RF amplifiers;

FIG. 7A is a display of Scout images, regions of interest used for $B_1$ shimming and $B_1$ maps acquired using 8 transmission channels and 8 RF amplifiers to drive the 16 RF coil transceiver array;

FIG. 7B is a schematic of a T1 weighted imaging pulse sequence using interdigitated RF and two RF pulse flows;

FIG. 7C is a display of T1 weighted images from a human head acquired using the pulse sequence depicted in FIG. 8B. The images were acquired using the 16 coil transceiver array with 8 transmit channels and 8 RF amplifiers.

FIG. 8A shows a simulated $B_1$ map of the homogenous RF distribution from a spherical phantom, (top middle) corresponding experimentally measured $B_1$ map of the homogenous RF distribution acquired from a spherical phantom, (top right) calculated map of the efficiency of the $B_1$ field $\eta(B_1)$ generated, (bottom left) simulated map of the SAR of the homogenous RF distribution, (bottom middle) experimentally measured SAR map of the homogenous RF distribution; (bottom right) calculated map of the efficiency of the electric field $\eta(E)$;

FIG. 8B shows maps of the E field amplitude (top) and phase (bottom) from a single RF coil;

FIG. 8C shows a simulated $B_1$ map of the ring RF distribution from a spherical phantom, (top middle) corresponding experimentally measured $B_1$ map of the ring RF distribution acquired from a spherical phantom, (top right) calculated map of the efficiency of the $B_1$ field $\eta(B_1)$ generated, (bottom left) simulated map of the SAR of the ring RF distribution, (bottom middle) experimentally measured SAR map of the ring RF distribution; (bottom right) calculated map of the efficiency of the electric field $\eta(E)$.

FIG. 9A is a schematic illustration of a pulse sequence using conventional pulse to coils 1-8 (top) and the interdigitated (bottom) equivalent grouping odd numbered (1, 3, 5, 7 $RF_A$) and even numbered (2, 4, 6, 8 $RF_B$) RF coils into separate groups;

FIG. 9B is a schematic illustration of the coil groupings for the pulse sequences shown in FIG. 10A;

FIG. 9C is an experimentally measured $B_1$ map for the ring distribution.

FIG. 9D shows a calculated E field for the ring distribution;

FIG. 9E displays a map of the temperature increase using the conventional pulse and the ring distribution;

FIG. 9F is a map of the temperature increase using the interdigitated pulse and the ring distribution;

FIG. 10A is a $B_1$ map of homogeneous excitation;

FIG. 10B is the corresponding electric field map;

FIG. 10C is a configuration to minimize heating when using interdigitated excitation of the homogeneous $B_1$ distribution (the red coils being group 1 and the blue coils being group 2);

FIG. 10D is a $B_1$ map for surface excitation;

FIG. 10E is a corresponding electric field map; and

FIG. 10F is a configuration to minimize heating when using interdigitated excitation of the ring $B_1$ distribution (the red coils being group 1 and the blue coils being group 2).

DETAILED DESCRIPTION OF THE PRESENT INVENTION

Overall, the present invention is a method and apparatus for generating the effective equivalent of a true single simultaneous transmission of excitation $B_1$ field pulses to a targeted living tissue using an existing MRI system or transceiver apparatus which structurally is limited by having a smaller number of independent transmission channels in operative communication with a larger number of individual transmit RF coils in a RF array. The unique methodology and apparatus of the invention is therefore suitable for use with any conventionally known and/or commercially sold MRI equipment or transceiver apparatus which operationally presents the requisite numerical difference between the lesser number of available independent transmission channels and the greater number of existing individual transmit RF coils in the RF array. Accordingly, the methodology is broadly and generally useful with many different types and formats of presently used MRI systems; and is of major value for performing a wide range of diverse magnetic resonance imaging applications.

1. In particular, the subject matter comprising the methodology and apparatus as a whole is able to perform and achieve the effective equivalent of a true simultaneous transmission of $B_1$ magnetic field pulses or bursts in series to a targeted living tissue or particular region of interest via a conventional RF array—by dividing a RF excitation pulse stream produced by the MRI assembly or transceiver apparatus into at least two separate and sequentially deliverable RF pulse flows; as well as by optionally altering at least one characteristic property of each discrete, sequentially deliverable RF pulse flow.

Then, in turn, each split and characteristically altered RF pulse flow is sequentially conveyed and individually delivered by all the available independent transmission channels to one of the different designated groupings or pre-selected subsets composed of multiple transmit RF coils (then present within the RF array) for a series of concurrent, but sequentially sent, collective transmissions of $B_1$ magnetic field pulses or bursts to a targeted subject.

Accordingly, the minimalist manner of performing the unique method requires that the initially produced RF excitation pulse stream be split into at least two discrete sequentially deliverable RF pulse flows, each of which is to be conveyed separately and individually by all the existing transmission channels to one of the different and distinguishable designated groupings of multiple transmit RF coils. This sequential conveyance event, in turn, results in a plurality of discrete collective transmissions of $B_1$ magnetic field pulses or bursts being sent in-series in a rapid-time sequence wherein:

(i) Each discrete transmission of $B_1$ magnetic field bursts is sent simultaneously and collectively by all the multiple transmit RF coils then constituting a single designated grouping; and (ii) The sending of two (or more) discrete transmissions of $B_1$ magnetic field bursts is made sequentially and in-series by different designated groupings of coils concurrently in a rapid-time manner; and (iii) Each of the concurrently made collective transmissions of $B_1$ magnetic field bursts sent in-series is directed to a single targeted living tissue or particular region of interest.

2. In addition, the preferred embodiments of the unique method will also cause at least one identifiable substantive alteration of not less than one characteristic property (and preferably several different characteristic attributes) in the split RF pulse flows, such that each sequentially deliverable RF pulse flow becomes substantively changed in at least one particular attribute or property; and therefore becomes identifiably different in either nature, and/or state, and/or form in comparison to its former or original condition.

In satisfaction of this option (required for the preferred embodiments alone), the alteration of not less than one characteristic property in the RF pulse flow is made via the overt performance and is the direct consequence of at least one act of intervention and manipulation selected from the group consisting of:

(i) Temporally concatenating the pulses forming the split RF pulse flow;
(ii) Interdigitating the pulses forming the split RF pulse flow;
(iii) Changing the timing sequence of the pulses in the split RF pulse flow; and
(iv) Changing the selectivity of the pulses in the split RF pulse flow.

Each of these particular actions is described in operational and functional detail below; and each of these various alternations may be performed alone in isolation or in combination with one or more other actions as the need or occasion warrants.

Major Advantages and Benefits of the Methodology:

A number of desirable advantages and unpredicted benefits are provided by the present methodology. Among these are the following:

1. For RF arrays where the number of individual transmit RF coils in the array exceeds the number of independent transmission channels, low angle non-selective RF pulses can be concatenated to provide performance virtually equivalent to simultaneous transmission, when $\theta<0.1$ radians, where $\theta$ is the pulse angle.

2. For RF excitation pulse streams using non-selective waveforms in sequence where the effective pulse angle $\theta>0.1$ radians, these RF pulses can be applied as interdigitated pulses where each pulse step, k, satisfies the criteria $\theta_k<0.1$. This change and effect provides virtually equivalent performance to simultaneous transmission.

3. The number of designated transmit RF coil groupings which can accept interdigitated pulses is not limited to merely two (2) subsets. To the contrary, larger numbers of designated RF coil groupings can individually accept interdigitated pulses by applying separate interdigitated RF pulse streams to each discrete designated grouping of transmit RF coils sequentially in series, and then repeating the sequential delivery process until the desired net pulse angle is achieved.

4. Simultaneous transmission using conventional amplitude modulated frequency selective pulses (e.g., sinc pulses) can be mimicked using interdigitation to achieve virtually equivalent performance using the criteria $\theta_k<0.1$ and $2\pi\nu\tau_k<<1$, where $\nu$ is the frequency in radian·Hz and $\tau_k$ is the duration in seconds of the individual pulse k.

5. RF coil transmission using adiabatic RF pulses—or with RF pulses having a combination of amplitude, frequency and phase variations—can be mimicked using interdigitation to achieve virtually equivalent performance using the criteria $\theta_k<0.1$ and $2\pi\nu\tau_k<<1$.

6. Overall power deposition in multi-slice sequences can be reduced by using short, multiple row arrays of transmit RF coils; as well as by only interdigitating those RF pulses where the effected volume has substantial contributions from transmit RF coils in different designated groupings of coils.

7. Power deposition can be controlled by judicious choice of which RF transmit coils are included within a designated grouping of transmit RF coils which are simultaneously excited and which are included within designated subsets of RF coils that are interdigitated.

8. Acquisition times can be shortened and power deposition can be reduced by using the multiple excitation bands created by interdigitation to acquire data from multiple regions simultaneously.

I. The Broad Scope of and General Applicability for the Unique Methodology

The instant invention provides a broadly useful method for generating the effective equivalent of a true simultaneous transmission of excitation signals (i.e., a single set of $B_1$ magnetic field pulses or bursts sent by all the existing transmit RF coils then present in the RF array) to a targeted living tissue using a conventional MRI system or transceiver apparatus which is structurally limited and has a relatively small number of independent transmission channels in operative communication with a RF array constituted of an arbitrarily chosen, far larger number of independent transmit RF coils.

This unique methodology is suitable for use with any conventionally known or commercially sold MRI equipment or transceiver construction which meets a single structural condition and circumstance, which is: There is a determinable and numerically measurable difference which exists between a fewer number of available independent transmission channels and a greater number of individual transmit RF coils.

As this single condition and circumstance is commonly found and routinely represents the clinical situation today, the present methodology is thus deemed to be very suitable for use with many older MRI system formats and transceiver constructions presently employed for many different clinical MRI procedures; and thus the instant method is broadly and generally useful as a markedly improved procedure which is both effective with and productive for many different applications of magnetic resonance imaging technology where the targeted object for MRI evaluation is a living tissue.

Alternative Definitions of the Methodology

It will be recognized and appreciated that the present method can be defined in the alternative as a minimalist and as a preferred procedure.

The full scope and considerable breadth of the minimalist method is demonstrated by the performance of only four (4) requisite manipulative steps, which are as follows:

Step 1: Accessing a MRI system having means for producing electromagnetic waveforms as a RF excitation pulse stream on-demand and wherein a lesser number of available independent transmission channels are in operative communication with a greater number of individual transmit RF coils in a RF array for the conveyance of a RF excitation pulse stream;

Step 2: Producing a RF excitation pulse stream suitable for conveyance by the available independent transmission channels to individual transmit RF coils in the RF array.

Step 3: Splitting the RF excitation pulse stream into not less than two separate and sequentially deliverable RF pulse flows, each of which is to be individually conveyed and delivered in sequential series via the existing number of independent transmission channels to different designated groupings of multiple transmit RF coils within the RF array.

Step 4: Sequentially conveying in series each of the split RF pulse flows via the independent transmission channels individually to one of the different designated groupings of multiple transmit RF coils in the existing RF array for separate and in-series transmissions of $B_1$ field bursts concurrently to a targeted living tissue, whereby an effective equivalent of a true simultaneous transmission of a $B_1$ magnetic field is achieved.

* * *

In contrast, the envisioned scope and coverage of the preferred method is demonstrated by the performance of merely five (5) manipulative steps, which are recited as follows:

Step 1: Accessing a MRI system having means for producing electromagnetic waveforms as a RF excitation pulse stream on-demand and wherein a lesser number of independent transmission channels are in operative communication with a greater number of individual transmit RF coils in an RF array for the conveyance of an RF excitation pulse stream;

Step 2: Producing a RF excitation pulse stream suitable for conveyance by the available independent transmission channels to individual transmit RF coils in the RF array.

Step 3: Splitting the RF excitation pulse stream into not less than two separate and sequentially deliverable RF pulse flows, each of which is to be individually conveyed and delivered in sequential series via the existing number of independent transmission channels to one of the different designated groupings of multiple transmit RF coils within the existing RF array.

Step 4: Altering the split RF pulse flows such that at least one characteristic property of the split RF pulse flow becomes is changed and becomes identifiably different, the alteration of the characteristic property being at least one action selected from the group consisting of (i) temporally concatenating the pulses of the RF pulse flow, (ii) interdigitating the pulses of the RF pulse flow, (iii) changing the timing sequence of the pulses in the RF pulse flow, and (iv) changing the selectivity of the pulses in the RF pulse flow.

Step 5: Sequentially conveying in series each of the altered split RF pulse flows via the independent transmission channels to one of the different designated groupings of multiple transmit RF coils in the RF array for separate and in-series transmissions of $B_1$ field bursts concurrently to a targeted living tissue, whereby an effective equivalent of a true simultaneous transmission of a $B_1$ magnetic field is achieved.

* * *

It will be noted and appreciated also that in the preferred definitions and practice of the methodology, the individual step of splitting of the RF excitation pulse stream into not less than two separate and sequentially deliverable RF pulse flows [recited as Step 3 above] can alternatively either precede or follow the individual step of altering the RF pulse trains such that at least one characteristic property of the RF pulses becomes changed [recited as Step 4 above].

It is expected and envisioned that the specific order and performance of these two manipulative acts will vary alternatively as necessary to meet the particular circumstances of use, and/or the structural capabilities of the existing transceiver apparatus. Consequently, it makes no meaningful difference and there is no significance to the actual performance order for these two steps—so long as both of these actions are performed in fact as a requisite part of the method.

II. Definitions

In order to avoid inconsistencies in terminology, eliminate ambiguities in denotative and connotative meanings, and to increase the clarity and completeness of comprehension and understanding, a set of carefully recited definitions are presented below. The nomenclature and terminology, as well as particular names, terms and jargon, will be employed consistently and repeatedly herein to describe and claim the present invention in a manner that not only sets forth what the present invention is and how it is to be made and used, but also separates and distinguishes the inventive subject matter from what it is not.

Radiofrequency (RF) Coil: The structural article as a whole which is used to generate radiofrequency pulses and/or detect radiofrequency return signals in magnetic resonance studies. Typically, a RF coil has a resonance receiving frequency in the range of 1 MHz-1 GHz, and a transmitted excitation frequency in the range of 3 Hz-3 GHz.

Transmit RF Coil: An RF coil able to send RF excitation signals to a targeted subject. This term is neutral, non-descriptive, and unrestrictive as concerns any capability to receive RF signals.

Receive RF Coil: An RF coil able to receive resonance RF signals from a targeted subject. This term is neutral, non-descriptive, and unrestrictive as concerns any capability to send or transmit RF signals.

Transmit-Only RF Coil: An RF coil which is used solely to send RF excitation signals to a targeted subject, but concomitantly is not used to receive RF signals.

Receive-Only RF Coil: An RF coil which is used to receive RF signals from a targeted subject, but concomitantly is not used to send RF signals.

RF Array: An organized set or displayed grouping of individual and separate radiofrequency (RF) coils which are employed in combination as a unified assembly and are collectively positioned as an aggregate in a determinable arrangement. Denotatively and connotatively, this collective term is restricted in its meaning and limited in its usage herein. It always identifies and invariably specifies only the unified assembly and aggregate format of multiple discrete RF coil structures; and never indicates nor refers to any of the component parts or constituent elements which are then present within any single RF coil structure.

RF Transmission Array: An array of RF coils typically used only for transmission of RF signals, and which is not used for reception of RF signals.

RF Reception Array: An array of RF coils used only for reception of signals, and which is not used for transmission of RF signals.

A True Simultaneous Transmission Of Excitation Signals: A single set of multiple $B_1$ magnetic field bursts sent simultaneously by all the existing transmit RF coils in the RF array.

Specific Absorption Rate (SAR): A measure of the rate at which energy is absorbed by the body when exposed to a radio frequency (RF) electromagnetic field. It is defined as the power absorbed per mass of tissue and has units of watts per kilogram (W/kg).

Transverse Electromagnetic ("TEM") Coils: TEM coils are constructed of transmission line elements including strip line elements, microstrip or coaxial transmission lines. These elements are typically geometrically arranged to act as a volume coil. This design is used to minimize radiative losses (power deposited outside of the sample or coil elements) and improve efficiency.

Surface RF Coils: Surface RF coils are individual inductive loops which typically circumscribe only a portion of the object which they are being used to image.

Volume RF Coils: Volume coils are comprised of multiple surface coils or other inductive structures and circumscribe or enclose the object they are imaging.

CRC Coils: Counter rotating current coils. Coils comprised of two loops in which current flows in opposite orientations (i.e. clockwise and counter clockwise) in the two loops.

Transmission Line Segment: A specialized cable designed to carry alternating current of radio frequency. Transmission line segments use specific conductor dimensions and spacing, and impedance matching, to minimize reflection and power loss.

Pulses (RF pulses): Temporally brief bursts of electromagnetic waveforms having time-varying magnetic fields. In magnetic resonance studies, these electromagnetic waveforms have a chosen radiofrequency which is typically the resonance frequency of the nucleus of interest in the targeted subject (usually 1 MHz-1 GHz, depending upon nucleus and static magnetic field strength).

Temporally Concatenated RF Pulses: Two or more complete distinct RF pulses which are applied sequentially in time.

Interdigitated RF Pulses: A pulse created by combining two or more distinct RF pulses by: (i) breaking each distinct RF pulse into 2 or more intervals; and/or (ii) temporally concatenating the $k^{th}$ pulse interval of each distinct RF pulse into a cycle (i.e. the $k^{th}$ cycle); and/or (iii) temporally concatenating individual cycles to form the complete interdigitated pulse.

Temporal Amplitude of Radiofrequency Pulses/Waveforms

Radiofrequency pulses are characterized by a sinusoidal temporal dependence of their electric and magnetic fields. For purposes of magnetic resonance, the magnetic field component is used to excite the nuclei of interest. The time dependence of the magnetic field component is given by $B_1 \sin(\omega t+\phi)$. The amplitude of the pulse is given by $B_1$—i.e., its maximum intensity in units of gauss (Gz), or tesla (T), or other equivalent unit format.

Spatial Amplitude Of Radiofrequency Pulses/Waveforms: The amplitude of an RF pulse will also vary in a spatially dependent manner in the sample. The spatial amplitude, $B_1(r)$ describes the variation of the pulse in terms of position, r, in the sample.

Phase Of Radiofrequency Pulses/Waveforms: The time dependence of the magnetic field component is given by $B_1 \sin(\omega t+\phi)$. The phase of the radiofrequency pulse is given by $\phi$ i.e. a temporally independent offset in units of radians or degrees.

Coherence Of Radiofrequency Pulses/Waveforms: When two or more radiofrequency pulses/waveforms of are applied simultaneously, their combined effect is given by the vector addition of the individual waveforms, including both amplitude ($B_1$) and phase ($\omega t+\phi$). When the phase terms for the two or more waveforms are identical, the waveforms will add constructively or "coherently" such that the combined amplitude is given by the simple sum of the individual amplitudes. Destructive interference occurs when the phase terms vary by $\pi$ radians such that the resultant amplitude is less than the sum of the individual amplitudes.

Selectivity Of Radiofrequency Pulses/Waveforms: RF pulses/waveforms have characteristic responses in the frequency domain, providing different net pulse angles as a function of frequency. The characteristic response with respect to frequency is determined by the overall duration of the pulse/waveform and the temporal variation of the amplitude and phase of the pulse/waveform. The characteristic response in the frequency domain determines the selectivity of the pulse/waveform.

$B_0$ Field: The primary static magnetic field generated and applied by a magnetic resonance imaging system to a targeted subject for MRI clinical evaluation.

$B_1$ Field: The time-varying magnetic field generated by a RF coil or transceiver apparatus which is applied perpendicularly to the main $B_0$ field and which is used to alter the orientation of the nuclear spins of the nuclei of interest in the targeted subject.

RF Shimming: The process by which the relative phases and amplitudes of the RF pulses applied to different RF coils within an array are selected so as to achieve a specific spatial distribution of the resultant $B_1$ field.

Performance ($B_1$/Watts): The intensity of the $B_1$ field generated by an RF coil(s) in a unit of intensity ($\mu$T, gauss or Hz equivalent), as a function of the power applied to the RF coil(s) to achieve that intensity.

$B_1$ Field Homogeneity/Inhomogeneity: The homogeneity or inhomogeneity of a $B_1$ field can be quantified by the standard deviation of the amplitude of the $B_1$ field over a given region.

Resonance Radiofrequency Signals: The radiofrequency signals emitted by nuclear spins following application of an excitation RF signal. The signals characterize the nuclear spins and manifest themselves as a time varying magnetic field.

High Magnetic Field Strength: Magnetic field strengths of about 7T-12T and above.

Low And Moderate Magnetic Field Strengths: A low magnetic field strength is about 1T-2T, while a moderate magnetic field strength is about 3T-6T.

Power And Power Deposition: The rate of energy generation or usage in watts or equivalent. For the purposes of magnetic resonance imaging, power deposition refers to the amount of power or rate of energy transferred to the object being measured.

III. The Underlying Major Problem Solved by the Present Invention

1. In order to excite homogeneously the entire transmission volume of a multi-row RF array, three events must occur:

First, all the individual transmit RF coils in the array must simultaneously be activated for generation of magnetic field signals;

Second, the individual transmit RF coils in the array must simultaneously transmit appropriate short bursts of $B_1$ magnetic field to the targeted living tissues; and Third, all the transmitted $B_1$ magnetic field bursts must be applied together, collectively and cumulatively, upon the targeted living tissue.

Typically, this series of events is caused by the sending of all the $B_1$ magnetic field bursts simultaneously from each independent transmit RF coil in the RF array together as a single transmission. However, owing to the severe structural limitation where the actual number of independent transmission channels (and RF amplifier channels) is relatively small and typically are far fewer in number than the total (and far greater) number of individual transmit RF coils, a true simultaneous transmission of $B_1$ magnetic field bursts from all the transmit RF coils constituting the RF array is not possible for almost all presently available MRI systems.

Thus, because the conventional MRI system equipment or transceiver apparatus is structurally limited in function and operation by having a greater number of independent transmit RF coils than the smaller number of available transmission channels, the RF excitation pulse stream conveyed by the independent transmission channels to the multiple transmit RF coils must be distinctly altered in order to be able to transmit a $B_1$ magnetic field whose net result and effect upon a targeted living tissue is substantively similar to that caused by a true simultaneous transmission of $B_1$ magnetic field bursts.

2. It is noted that, during a true simultaneous transmission, the RF fields from each of the n coils (each RF coil generating a magnetic waveform having a specific amplitude and phase) combine as vectors to yield a single net effective $B_1$ field, wherein the single vector is characterized by having a single net amplitude and phase which is generally spatially dependent (see Equation 1).

$$B_1(\text{net}) = B_1 e^{-i\phi} = \sum_{m=1}^{n} B_{1m} e^{-i\phi_m} \quad \text{(Equation 1)}$$

For single spin systems, the effect of the excitation RF magnetic field on the targeted living tissue sample (i.e., where the initial magnetization state $I_0$ is converted to $I_f$) is given by the product of 5 (3×3) rotation matrices—i.e., $I_x$, $I_y$ and $I_z$ where $\phi$ is the phase of the pulse, $\alpha$ is the off resonance angle, $\theta$ is the effective pulse angle, and $\tau$ is the duration of the pulse.

For complex waveforms where $B_1$, $\phi$ and $\nu$ vary in a time-dependent fashion, the electromagnetic waveform can be divided into L intervals, with differing $B_1$, $\nu$, and $\tau$ values (see Equation 2).

$$I_f = \left\{ \prod_{K=1}^{L} (\phi_k I_z)(-\alpha_k I y)(\theta_k I x)(\alpha_k I y)(-\phi_k I_z) \right\} I_0 \quad \text{(Equation 2)}$$

$$\alpha = \tan^{-1}(\nu/B_1)$$

$$\theta = \left[ (B_1^2 + \nu^2)^{1/2} \tau \right] / 2\pi$$

Thus, if and when one temporally concatenates the pulses in the RF pulse stream which is then sent to individual transmit RF coils, not less than three (3) substantively different primary complications invariably occur:

Primary Complication 1: The vector summation of all transmission channels being able to provide a single coherent RF pulse stream is lost because the RF pulse stream is now broken into two or more separate pulse trains, wherein the electromagnetic waveforms in each of the two or more separate pulse trains has a generally different spatial and temporal amplitude and phase characteristics than the intended single coherent RF pulse stream.

Primary Complication 2: The effect of producing a single coherent $B_1$ magnetic field on the spin system (i.e., the nuclei of the living tissue sample) is lost because the RF pulse stream is now broken into separate pulse trains having generally different spatial amplitude and phase relationships. Since the rotation matrices do not generally commute, the net effect on the spin system of the nuclei in the targeted living tissue sample will not be linearly additive.

Primary Complication 3: Even for regions of the targeted living tissue sample which are almost exclusively affected by $B_1$ magnetic field bursts from a single group of RF transmit coils, the negative effects of a no pulse interval (i.e., the time period during which the RF pulse stream is conveyed by the limited small number of transmission channels to only a portion, but not all, of the available transmit RF coils) must also be factored into the overall effect. During this no pulse time interval, magnetization affected by only a portion of the transmit RF coils will continue to precess by its off-resonance frequency $\nu$ (i.e., $I_f = \{(\nu\tau/2\pi)I_z\}I_0$), thereby changing its overall phase relationship to the next pulse and $B_1$ magnetic field burst applied from those RF coils.

Each of these three major primary complications is effectively overcome by the broad method of the present invention.

IV. The Unique Multiplexing Concept

The multiplexing concept of the present invention allows the use of conventionally known MRI system equipment and commercially sold transceiver apparatus having a RF array constituted of 8, or 16, or 32 (or even more) independent transmit RF coils to be more advantageously employed—despite their structural limitation that these assemblies and constructions provide only a very small number of available independent transmission channels by which to convey an RF excitation pulse stream to a far larger number of transmit RF coils in the RF array. The inventive multiplexing technique thus enables the use of markedly larger numbers of transmit RF coils in combination with relatively few and far smaller numbers of independent transmission channels; and despite the substantial discrepancy in numbers, yet is able to provide substantially improved homogeneity, targeted object coverage and facilitated multiband selection for the RF array—while concurrently decreasing the time intervals needed for high resolution imaging.

Moreover, unlike conventional splitters of RF pulses, the present multiplexing approach (in combination with rapid-time RF switches) allows the phase and amplitude settings of the electromagnetic waveforms in the RF pulse stream to be optimized for each targeted tissue slice, thereby creating far better performance results and allowing the long-desired use of multiple $B_1$ distributions within a RF pulse train.

The unique multiplexing method and approach can also be beneficially used to obtain MRSI sequences, which clinically can provide extended brain tissue coverage. In addition, the multiplexing method can be beneficially used to evaluate MRI negative deficits (typically caused by and the result of exposure to explosive blasts on the battlefield). For example, the multiplexing procedures allow currently available MRSI systems to resolve between deficits associated with psychological issues which arise because of post-traumatic stress disorder (PTSD) versus a true organic matter injury to the brain due to traumatic brain injury (TBI)—a major clinical diagnostic issue which has become a critical branch point in deciding what is to be an effective medical treatment. Thus, the multiplexing procedure of the present invention gives the conventionally available MRSI system the long needed capability of detecting "organic" injury in this MRI brain negative group of battlefield patients; and this previously impossible capability represents a most significant and highly desired advancement in this clinical diagnostic field.

The Multiplexing Procedure

In order to multiplex all the multiple transmit RF coils then present in the existing RF array, the initial stream of RF excitation pulses to be conveyed by the available number of independent transmission channels is spilt into not less than two (and typically more than two) discrete RF pulse flows, each of which is individually routed and conveyed separately by a groups of existing transmission channels to the multiple transmit RF coils constituting a single designated grouping of coils within the RF array. Then in serial sequence, each split RF pulse flow is individually routed and separately conveyed to the multiple transmit RF coils forming a second and different designated grouping. This conveyance procedure is repeated sequentially in series for as many different designated groupings of multiple transmit RF coils as are present within that RF array.

The Unique Rapid-Speed RF Switch

In order to minimize off-resonance precession during the conveyance of the split RF excitation pulse flows, as well as to preserve overall efficiency, the time intervals required to change the routing of the RF output of the RF transmission channels to different designated coil groupings (corresponding to individual split RF excitation pulse flows) requires rapid switching within a short time period.

To provide this capability and function, a moderate power (1 kW), high speed (500 ns), low insertion loss (0.2 dB), a rapid-speed RF switch is utilized as described in detail below; and this rapid-speed RF switch is able to be advantageously employed, for example as shown by FIG. 6A, to connect eight (8) independent transmission channels to two (2) different and individual designated groupings of coils formed of eight (8) transmit RF coils each—thus totaling sixteen (16) transmit RF coils collectively for the entire RF array. In this manner, each designated grouping of eight (8) transmit RF coils is arranged and organized by discrete rows—as shown by FIG. 1C wherein row A is Designated Grouping I and includes RF coil nos. 1-8 respectively, and wherein row B is Designated Grouping II and includes RF coil nos. 9-16 respectively.

Also, as is empirically demonstrated hereinafter for this exemplary and representative embodiment, the two "multiplexed" and sequentially delivered flows of RF pulses which are collectively and cumulatively conveyed to each of the different designated groupings of coils (each having 8 transmit RF coils) using the pre-existing eight (8) independent transmission channels in combination with a high-speed RF switch gives nearly identical performance and clinical results comparable to a truly simultaneous 16 channel transmission of a single RF excitation pulse stream.

Thus, as illustrated by FIG. 1C, a 8 coil×2 row RF array providing two (2) designated groupings of eight (8) coils each (a total of 16 individual transmit RF coils in all) not only can be driven by eight (8) independent transmission channels, but also will provide doubled longitudinal coverage, while concurrently increasing SNR and $B_1$ homogeneity—a major difference in comparison to a directly analogous 8 coil×1 row RF array.

It is expected and intended also that an alternative RF array organization having a 8 coil×3 row transmission arrangement (i.e., 3 designated groupings of 8 transmit RF coils each which yields a total of 24 individual transmit RF coils in all) will yield even better results for conventionally available MRSI clinical systems.

V. Access to a Conventional Operative Mri Assembly

A major part of the present invention is a broad method for improving the performance of currently available and conventionally operative magnetic resonance imaging systems and assemblies. Such MRI equipment purposefully creates and employs a spatially uniform and temporally constant main $B_0$ magnetic field over a known spatial volume, within which a second magnetic field of an appropriate proton resonant frequency (the $B_1$ field) is superimposed perpendicularly to the main $B_0$ field for nuclear spin magnetization and resonance in a targeted living tissue.

For this purpose, the magnetic resonance imaging assembly equipment typically includes a set three of gradient coils for the generation of the linear gradient magnetic field (the main $B_0$ magnetic field), by which spatial encoding of the nuclear spin magnetization is achieved. During the magnetic resonance procedure, $B_1$ magnetic field bursts of known radiofrequency and switched gradient magnetic fields are applied to a targeted subject (such as a live human patient) to generate magnetic resonance emission signals—which are then detected and stored to obtain information subsequently used to reconstruct spectral plots and visual images of the targeted object. These procedures control and determine the quality of the reconstructed spectra and visual images obtained; and include such features as location and orientation in the targeted subject, dimensions, resolution, signal-to-noise ratio, and contrast. The operator of the magnetic resonance imaging system typically selects the appropriate sequence; and routinely adjusts and optimizes its operational parameters for the particular application in order to obtain the best results.

An Accessible Pre-Existing MRI System

1. The present invention expects and intends that the user of the method will have access to a conventional and presently existing MRI system, assembly, and/or transceiver apparatus which is suitable for magnetic resonance imaging of a targeted living tissue then lying within a magnetic field having a strength not less than about 3T. This presently existing MRI equipment and/or transceiver apparatus will demonstrably have a small number of independent transmission channels in operative correspondence with a larger number of independent transmit RF coils which are disposed as a discrete RF array. Thus the conventional MRI assembly structurally will comprise:

(α) means for producing a RF excitation pulse stream on-demand;

(β) a fixed but lesser number of independent transmission channels, each of these transmission channels being able to convey the produced RF excitation pulse stream to one of the independent transmit RF coils in the RF array; and (γ) at least one discrete RF array comprised of a fixed but greater number of transmit RF coils, each said transmit RF coil being able to generate a $B_1$ magnetic field as a series of magnetic pulses or bursts having predetermined spatial and temporal amplitude and phase characteristics, and to transmit the generated $B_1$ magnetic field bursts to a targeted living tissue then lying within a $B_0$ magnetic field having a strength not less than about 3T.

2. Such conventional MRI system equipment is widely used today for performing nuclear magnetic resonance imaging ("MRI"), nuclear magnetic resonance spectroscopy ("MRS"), and nuclear magnetic resonance spectroscopic imaging ("MRSI"). Typically however, conventional MRI system equipment is comprised of one or more transmit-only RF coils—i.e., an RF coil which is used to send RF excitation signals to a targeted subject, but which is not used to receive RF signals from the targeted subject; a limited and relatively small number of transmission channels; a plurality of independent receive-only RF coils; a large number of independent receiver channels; and an RF amplifier or similar source for transmission purposes, as well as acquisition and reconstruction computer(s) for analysis of received signals.

It will be recalled and recognized also that within such conventional MRI systems and assemblies, both the performed actions of signal transmission and of signal reception are unidirectional in implementation and sequence order—i.e., the sending of a RF pulse stream operationally occurs sequentially in series from independent RF transmission channel(s) to RF amplifier(s), to the transmit only RF coils used for transmission, and then outwardly to the living tissue target; while the operational performance and event of resonance signal reception by the transceiver is also an unidirectional sequential series of actions beginning with the emission of RF resonance signals from the living tissue target, to the receive-only RF coils used for reception, to RF receiver channels, and then finally to acquisition and reconstruction computer(s).

It is also important to recall that in the transmission of RF pulses to a targeted object, the spatial pattern of the transmitted $B_1$ magnetic field is determined by the structural geometry of the RF coil(s) used for transmission, and the combination of the amplitudes and phases of the waveform pulses in the transmitted electromagnetic stream. Thus, by changing the phase and amplitude of the electromagnetic waveforms in the pulse stream conveyed by the independent transmission channels (and amplifiers) to each individual transmit RF coil, the overall spatial pattern and intensity of the $B_1$ magnetic field applied to a targeted object can be markedly varied.

Consequently, by making an appropriate alteration of phase and amplitude of the waveforms in the RF pulses delivered to each transmit RF coil in the MRI system equipment, the $B_1$ field can be made either more homogeneous or contoured so as to effect, excite, or perturb certain spatial locations. The spatial pattern of the reception field can be then detected individually by each RF coil and digitized for evaluation purposes; or alternately can be combined to a single output by the use of appropriate combiners and phase shifters and then digitized for evaluation purposes.

3. As is conventionally performed, lower magnetic field strength applications [i.e., 1.5T (body) and 3T (head)] often use a MRI assembly having one large, single drive, transmission-only volume RF coil in combination with multiple-coil/receive only RF arrays in order to provide for homogeneous transmission and high efficiency reception. However, when employed at moderate to high magnetic field strength applications [such as 7T (head) and 3T (body)], these large transmit-only, single drive volume RF coils suffer from poor homogeneity and low efficiency owing to strong interactions between the generated transmission field and the targeted tissue [see for example: Vaughan et al., "7T vs. 4T: RF power, homogeneity, and signal-to-noise comparison in head images", *Magn. Reson. Med.* 46(1):24-30 (2001)].

In recognition of this recurring problem for moderate to high magnetic field strength applications, a variety of differently constructed transceiver apparatus has been devised and developed. It will be recalled that a transceiver apparatus, both by definition and convention in the art, differs from other types of MRI transmission equipment in that transceivers are constructed of multiple independent RF coils wherein each RF coil in the disposed RF array is capable of both RF pulse transmission as well as resonance RF signal reception.

Thus, it will be noted that, in these various transceiver constructions, the RF arrays are structurally constituted of multiple independent transmit and receive RF coils, wherein each RF coil is independently capable of performing both transmission and reception of differing radiofrequency signals. Note also however that, because of this distinguishing dual-function capability for such RF coils, the number of transmit RF coils is thus clearly equal to the number of receive RF coils; and thus the number of transmit RF coils typically has become not only become markedly increased, but also the number of transmit RF coils is now far greater than the available number of independent transmission channels typically present in the older and pre-existing MRI system assemblies.

4. Although modern MRI systems are typically equipped with many independent receiver channels [16-32 receiver channels are commonly found on existing state of the art clinical MRI systems—a number matching or larger than the number of independent coils in receive-only phased arrays], the true number of transmission channels in these MRI systems is typically limited to only one or two, with the most advanced clinical research MRI systems typically having only 8 independent transmission channels by which to communicate with and serve all the individual transmit RF coils in the RF array.

Thus, in order to achieve a homogeneous transmission for RF arrays having more than 8 independent RF coils, the user frequently must externally add to and operationally supplement the existing MRI system with a number of discrete extra independent transmission channels in an ad hoc manner such that there subsequently are additional transmission channels available for conveyance purposes—a discretionary and arbitrary arrangement which is structurally awkward in operation as well as costly in its construction, and is not a suitable arrangement for most currently used clinical MRI systems.

Alternatively, as has been empirically demonstrated [see for example: Avdievich et al., "Short echo spectroscopic imaging of the human brain at 7T using transceiver arrays", Magn Reson Med. 2009 July; 62(1):17-25], splitting the power of one transmission channel to two or more different transmit RF coils in the array is ineffective—as the required phase and amplitude relationships between any two or more coils will vary considerably (depending on the interactions of the coil with the sample or specific body region).

Consequently, even transceiver RF arrays which are structurally constituted of multiple independent transmit/receive RF coils suffer from the same defects and deficiencies as transmission arrays constituted of transmit only RF coils.

The Structure of Conventionally Known RF Coils

A single RF coil can have multiple elements and components. Thus, a single RF coil can be alternatively identified as a transverse electromagnetic ("TEM") coil, or as a volume coil, or as a surface coil, or as a CRC coil, or as a transmission line segment. In various conventionally known formats, a single RF coil structurally can and will include multiple strip-lines, micro-strips and TEM elements as separate distinguishable elements, and/or current controls (e.g. capacitors, inductors, PIN diodes etc.) as separate components.

By definition herein (as well as by commonly held understanding in this technical field), an "element" is only a part of one complete RF coil structure; and consequently, it will be recognized that all "elements" and "components" as such are merely those particular constituent entities and operative subdivisions then present within a single RF coil structure. Accordingly, a single RF coil commonly and routinely contains multiple discrete elements and components whose actual number is routinely varied to meet particular use conditions and applications [see for example U.S. Pat. No. 6,969, 992].

Thus, a single multi-element radiofrequency coil is often constructed as an 8-element structure. However, a single RF coil having either a greater number or a lesser number of such discrete elements is conventionally known. For example, in its various forms, a single RF coil can contain 4 elements, or 16 elements, or even 32 elements [again see U.S. Pat. No. 6,969,992]. Nevertheless, regardless of the number of elements actually present in the overall structure, each of these structures constitutes only one single RF coil.

In addition, specialized RF coils for application-specific imaging modalities are common in the field of magnetic resonance imaging (MRI). In particular, for the magnetic resonance imaging of the female breast in horizontal and vertical clinical MR instruments, a number of single-loop and multi-loop RF coil concepts for single channel, quadrature, and phased array configurations have been devised. Examples of these RF coil concepts are described by U.S. Pat. Nos. 7,084,631; 6,850,065; 6,493,572; 6,377,836; 6,163,717; 6,023,166; and 5,699,802—each of which is expressly incorporated by reference herein.

A Preferred and Exemplary Transceiver Apparatus

As merely one representative example of a preferred transceiver apparatus, attention is directed to the transceiver apparatus which is the subject matter of co-pending U.S. patent application Ser. No. 13/199,074 filed Aug. 18, 2011 (which is itself a Continuation of International Patent Appl. No. PCT/US2010/000871 filed on Mar. 24, 2010). Accordingly, the entirety of U.S. patent application Ser. No. 13/199,074 filed Aug. 18, 2011 is expressly incorporated by reference herein.

Attention is therefore directed to FIG. 1 as a whole, wherein FIG. 1A is a schematic illustration of 8 RF coil transceiver array arranged in a single elliptical row of 8 RF coils; FIG. 1B is a photograph of actual RF coils arrayed in a transceiver with cosmetic covers in place; FIG. 1C is a schematic illustration of a 16 RF coil transceiver array, featuring elliptical two rows of 8 RF coils and in which the top row of 8 RF coils is sloped to provide a "better fit" to the contours appearing at the top of the human head; and FIG. 1D is a photograph of other RF coils arrayed in a transceiver with cosmetic covers in place.

It will be appreciated that the transceiver and RF array illustrated in FIG. 1 as a whole uses inductive decoupling to minimize coupling between the individual transmit RF coils (better than 16.5 dB) which provide for both the transmission and reception of magnetic field signals independently. A split design (see FIGS. 1A and 1B) enables the RF coils to be configured appropriately in order to accommodate different head sizes through use of different anterior portions (see FIG. 1C). This maintains the distance between the RF coil and head at ~1-3 cm across different individuals. A consistent gap distance is critical to preserve decoupling and transmit/receive efficiency which are load and distance dependent.

Furthermore, Table 1 (provided below) presents performance data obtained from the first 100 human patient studies using this 8×1 coil array of FIG. 1A; and the empirical results are categorized by RF coil top placement and brain tissue location data. Also as presented, it will be noted that MRI system efficiency decreases with increasing RF coil size; and that owing to the high magnetic field effects, the more inferior brain tissue locations show ever-smaller reduced efficiencies.

Nevertheless, for any given brain tissue location and RF coil configuration, the transmit performance (µT/kW) and homogeneity are consistent across all the living human subjects. Note also that in the medial temporal lobe, the overall homogeneity is reduced due to the angulation (along the temporal pole) which places the posterior and anterior portions of the brain tissue slices being at or beyond the edge of the 9 cm single row coil array longitudinally. In addition, this 8×1 coil array achieves 1.9× more $B_1$ at equivalent voltage in comparison to the RAPID 8 element transceiver array and a factor of 1.87 better SNR [comparison data via courtesy of Dr. T. Ibrahim, Univ. Pittsburgh].

TABLE 1

Performance of the 8 coil × 1 row transmission array in 100 living human subjects: *

| | Performance | | | | | |
|---|---|---|---|---|---|---|
| | Location | | | | | |
| | Motor&SMA | | CSO&Thal | | Temporal | |
| Coil Size | n | µT/kW | n | µT/kW | n | µT/kW |
| Small | 11 | 19.49 ± 0.66 | 13 | 18.30 ± 1.97 | 2 | 16.37 ± 0.19 |
| Medium | 11 | 17.68 ± 1.57 | 35 | 15.95 ± 1.37 | 14 | 14.82 ± 1.42 |
| Large | 0 | | 6 | 14.58 ± 2.14 | 8 | 13.14 ± 1.10 |

TABLE 1-continued

Performance of the 8 coil × 1 row transmission array in 100 living human subjects: *

| | Homogeneity | | | | | |
|---|---|---|---|---|---|---|
| | Location | | | | | |
| | Motor&SMA | | CSO&Thal | | Temporal | |
| Coil Size | n | SD, % | n | SD, % | n | SD, % |
| Small | 11 | 8.58 ± 1.84 | 13 | 10.27 ± 1.64 | 2 | 18.89 ± 1.77 |
| Medium | 11 | 9.01 ± 2.25 | 35 | 11.41 ± 2.39 | 14 | 18.77 ± 2.61 |
| Large | 0 | | 6 | 11.23 ± 1.54 | 8 | 18.21 ± 1.43 |

* Motor and supplementary motor areas (Motor &SMA); centrum semi-ovale and subcortical nuclei (CSO&Thal); and medial temporal lobe (Temporal).

The dual capability for the single 8×1 RF coil array of FIG. 1A (being able to both transmit and receive RF signals) improves both the homogeneity and transmission efficiency by allowing the phase and amplitude of the transmission field generated by each coil in the array to be optimized to compensate for the interactions with the targeted living tissue [see for example, Adriany et al., "A geometrically adjustable 16-channel transmit/receive transmission line array for improved RF efficiency and parallel imaging performance at 7 Tesla", Magn Reson Med. 2008 March; 59(3):590-7; and Hetherington et al., "RF shimming for spectroscopic localization in the human brain at 7 T", Magn Reson Med. 2010 January; 63(1):9-19.].

Moreover, the ability of the multiple independent RF coils in a transceiver to receive, as well as transmit, signals preserves reception sensitivity. However, to maintain sensitivity, the individual RF coils in the transceiver array are of necessity relatively small in size (see FIGS. 1A &1B), which limits their overall length dimension (head to toe direction); constrains their longitudinal coverage; and reduces SNR (signal to noise ratio) at their edges. These restrictions and limitations can be overcome by increasing the number of individual RF coils in the transceiver array, and is exemplified via the use of multiple rows of smaller coils disposed along the z axis (see FIGS. 1C & 1D).

VI. Splitting a Produced Rf Excitation Pulse Stream Into Not Less Than Two Separate and Sequentially Deliverable Rf Pulse Flows This overt manipulation is a requisite part of each embodiment and every practice of the method; and this manipulative step can be performed alone in isolation or optionally together in combination with one or more modes of characteristic property alteration. For this reason, it is important to recognize what this overt action is and to and distinguish it from any of the four manners of characteristic property alteration, which may or may not be concurrently performed.

Definitionally, this recited requirement of both the minimalist and preferred method may be generally implemented by performing the steps of:

initiating the production of a RF excitation pulse stream by the MRI system assembly; and splitting said produced RF excitation pulse stream into at least two separate and sequentially deliverable RF pulse flows, each of which is to be independently and sequentially conveyed by the existing number of transmission channels in the MRI system to one of the different designated groupings of multiple transmit RF coils within the RF array.

1. The original RF excitation pulse stream which would be used for generating a true simultaneous transmission of signals is composed of N distinct RF waveforms, which are to be simultaneously delivered to N discrete RF coils in the RF transmission array, with each RF waveform associated uniquely with one and only one transmit RF coil.

In order to cleave the initial RF excitation pulse stream into two or more "split RF pulse flows", the transmit RF coils that would receive output via the original RF excitation pulse stream are purposefully partitioned into two or more discrete designated groupings of coils such that the number of transmit RF coils in any one designated grouping does not exceed the number of available RF transmission channels; and wherein each transmit RF coil belonging to that individual designated grouping is assigned to conveyance of one and only one split RF pulse flow.

The choice of which transmit RF coils are chosen to be grouped together as a single designated grouping for the conveyance of a specified split RF pulse flow as simultaneous transmission output is based on the desired effect of the original RF excitation pulse stream and the instantaneous $B_1$ and E field distributions created by the simultaneous output of the transmit RF coils used together in that particular designated grouping of coils.

Since each RF waveform in the original RF pulse stream is uniquely specified for output by a specified transmit RF coil within the existing RF array, that individual RF waveform is then assigned to be a member of the specified "split RF pulse flow" which is affiliated with that same specific and corresponding transmit RF coil. Thus, a "split RF pulse flow" is defined logically as—that set of RF waveforms present in the original RF excitation pulse stream which are to be output to the specified transmit RF coils then assigned to be part of one particular designated coil grouping (and associated with conveyance of that specified split RF pulse flow).

The individual RF waveforms constituting a specific "split RF pulse flow" are then directed and linked to one—and only one—of the existing and then available transmission channels. Thus, although each of the existing and available transmission channels will generally be responsible for delivering individual RF waveforms as two or more split RF pulse flows, it will also be responsible for delivering a particular RF waveform to one and only one transmit RF coil within each individual designated grouping of coils defined by a specific "split RF pulse flow".

2. On a purely technical level, the following therefore applies: To achieve an effectively equivalent performance to that of a true simultaneous transmission of rf excitation signals to all the transmit RF coils in the existing RF array, each RF excitation pulse stream is divided into n×m segments or time intervals, where "m" is the number of RF pulse flows and "n" is the number time steps used in an individual RF pulse flow with nonzero RF amplitude.

During each segment or time interval in the RF excitation pulse stream, the amplitude of the applied RF is nonzero in one and only one RF pulse flow. Thus, application of n segments or time intervals with nonzero RF amplitudes to m RF coil groups (one RF pulse flow per pre chosen RF coil group) requires a total of n×m segments or time intervals.

The amplitude and duration of RF applied during any of these n time intervals is governed by the requirement that the net pulse angle $\theta_k$, experienced during the $k^{th}$ segment or time interval satisfies the condition that $\theta_k<0.1$. Additionally, when only a single band of excitation is desired, the duration of each segment or time interval $\tau_k$ (should satisfy the condition $2\pi\nu\tau_k<<1$ for the desired frequency range γ. Thus, the duration and hence minimum number of discrete nonzero amplitude segments and time intervals used to form the RF pulse flow is determined by satisfaction of these two criteria.

In practice, the individual n×m time segments of the m RF pulse flows comprising the entire RF stream are applied in serial sequence. As described previously, each time interval in the RF pulse stream is characterized by a non-zero RF amplitude for one and only one RF pulse flow. During each discrete segment or time interval, a high speed RF switch routes and conveys the RF output of the transmission channels (i.e., the RF amplitudes and phases of the RF pulse flow with nonzero amplitude) to the specified designated grouping of transmit RF coils associated with that particular RF pulse flow. Thus, a single transmission channel is alternately connected to m different transmit RF coils in the RF array during conveyance of the RF pulse train. However, at any point in time, each transmission channel is actively connected to at most a single—but routinely different—specified transmit RF coil.

3. Operationally therefore, the invention splits the produced RF excitation pulse stream into not less than two separate and sequentially deliverable RF pulse flows, in order that each of the discrete pulse flows then can be individually conveyed and delivered via the existing number of independent transmission channels to one of the different designated groupings of coils in the RF array.

The optimal "split number" of RF pulse flows is directly dependent upon the decision of how many individual designated groupings of coils are to be formed within the existing RF array. It is preferred that there be a 1:1 correspondence between the number of split RF pulse flows and the number of different designated groupings of coils. Thus for example, if there are eight individual designated groupings of coils, then the preferred "split number" of individual RF pulse flows should also be eight. Alternatively, if there are four individual designated groupings of coils, then the preferred "split number" of individual RF pulse flows to be created should correspondingly be four.

However, it will be appreciated that the number of different designated groupings of coils—in turn—is itself dependent upon the total number of transmit RF coils existing within the RF array and the available number of independent transmission channels then present within the existing MRI assembly. Moreover, the number of transmit RF coils within a separate and distinguishable designated grouping of RF coils is directly dependent upon and will vary with: (i) the existing number of independent transmission channels which are then available for use within the accessible MRI system assembly; and (ii) the requirement to control the spatial distribution and strength of the instantaneously generated E and $B_1$ fields.

Desirable Practices and Operational Insights

1. The present method uses a previously existing MRI system assembly and/or transceiver apparatus for the initial production of a conventional RF excitation pulse stream. Thus, in keeping with common practice, the produced RF excitation pulse stream will have a known length/size and definite time duration. Also the electromagnetic waveforms constituting each pulse in the excitation pulse stream will have predetermined spatial and temporal amplitude and phase characteristics.

2. The instant method requires that the produced RF excitation pulse stream will be split into not less than two (2) discrete RF pulse train fragments, each split-off RF pulse train fragment herein being identified as "RF pulse flow". However, the actual number of split RF pulse flows or RF pulse trains that are produced may be much greater than two in number; and often will be three (3), four (4), or even more in number.

3. The decided number of discrete split RF pulse flows that are purposely created by the intentional splitting of the initially produced RF excitation pulse stream is controlled by the following parameters:

(a) The actual number of RF coils in the transceiver apparatus and the number of transmission channels that are then present and available for use within the accessible MRI assembly; and (b) The selected number of transmit RF coils which will constitute and form a single designated grouping of coils within the existing RF array.

(c) The spatial orientation and instantaneous E and $B_1$ fields generated by the RF coils which constitute and form the designated grouping of coils within the existing RF array.

4. In practice and general operation, the decided number of generated individual split RF pulse flows will typically be equal to: the actual number of RF coils in the transceiver array divided by the number of independent transmission channels then present in the structure of the MRI system; and this decided number will never be greater than the total number of transmit RF coils within the RF array.

Thus, as one general guideline and rule of good practice, the step of splitting the produced RF excitation pulse stream into a plurality of discrete sequentially deliverable RF pulse flows should create (if and when possible) a direct 1:1 ratio and operative correspondence with the number of designated groupings of coils.

5. Accordingly, to illustrate the practice and result of this guiding principle—if the total number of individual transmit RF coils in the existing RF array is sixteen (16) coils in all—then it is most desirable that:

(a) If the existing MRI assembly contains only two (2) independent transmission channels, then consequently there must be no less than eight (8) discrete designated groupings wherein each discrete grouping individually has two (2) transmit RF coils—and then the initially produced RF excitation pulse stream is intentionally split into eight (8) discrete "RF excitation pulse flows".

It will be noted and appreciated that, in this specific illustrative instance, the number of split RF pulse flows [eight separate flows] is equal to the actual number of RF coils sixteen (16) divided by the number of independent transmission channels [2 transmission channels] then present and available for use in the accessible MRI assembly or transceiver apparatus.

(b) If the existing MRI equipment contains four (4) independent transmission channels, then consequently there must be at least four discrete designated groupings of coils wherein each grouping is constituted of four (4) transmit RF coils—and then the initially produced RF excitation pulse stream is to be split into four (4) or more different and distinguishable "sequentially deliverable RF excitation pulse flows".

It will be recognized and noted that, in this $1^{st}$ alternative illustrative instance, the decided number of split RF pulse flows [4] is also equal to or will be greater than the number of RF Coils (16) divided by the actual number of independent transmission channels [4 transmission channels] then present and available for use in the accessible MRI assembly or transceiver apparatus.

(c) If the existing MRI assembly contains eight (8) separate transmission channels, then consequently there must be at least two (2) discrete designated groupings of coils wherein each grouping is individually constituted of eight (8) transmit RF coils—and then the initially produced RF excitation pulse stream is to be split into two (2) individual and sequentially "deliverable RF pulse flows".

It will be observed and considered that, in this third illustrative instance, the selected number of split RF pulse flows [2] is equal to the number of RF coils (16) divided by the actual number of independent transmission channels [8] then present and available for use in the accessible MRI assembly or transceiver apparatus.

VII. Sequentially Conveying Each Split Rf Pulse Flow Via the Existing Number of Transmission Channels to the Multiple Transmit Rf Coils in Each Designated Grouping of Coils This intentional manipulative act is also a requisite part of each embodiment and every practice of the method. For this reason, it is important to recognize what this purposeful action is and the manner in which it to be performed.

Operationally by definition, the act of conveyance further comprises:

dividing the total number of independent transmit RF coils constituting the existing RF array into not less than two different designated groupings formed of multiple transmit RF coils;

conveying one of said split RF pulse flows via the available independent transmission channels to at least a first designated grouping of multiple transmit RF coils for a collective transmission of a first set of $B_1$ magnetic field bursts; and then rapidly conveying one of said split RF pulse flows via the available independent transmission channels to at least a second designated grouping of multiple transmit RF coils for a collective transmission of a second set of $B_1$ magnetic field bursts.

Procedural Aids and Operational Guidelines

1. The present method intends and expects that the division of the existing RF array in the accessible MRI assembly or transceiver apparatus will result in the formation of not less than two (2) individual designated groupings and discrete subsets constituted of multiple transmit RF coils; and that each individual designated grouping of coils will be constituted of at least one transmit RF coil. Consequently, the method of multiplexing will always generate a plurality of discrete designated groupings of transmit RF coil(s). However, it is preferred that each discrete designated grouping will be constituted of a preselected number of transmit RF coil(s) whose individual disposition, orientation and spatial positioning within the RF array are then known to the user.

2. It is desirable that the true number of multiple transmit RF coils forming each discrete designated grouping of coils be equal, if at all possible under the particular use circumstances, to achieve best results. Thus, for illustrative purposes only, the following examples are provided:

(i) If the existing RF array contains only eight (8) transmit RF coils in all, then two (2) individual designated groupings having four (4) transmit RF coils each should desirably be created—Or alternatively, four (4) individual designated groupings having two (2) transmit RF coils each can be formed;

(ii) If the existing RF array contains sixteen (16) transmit RF coils in all, then two (2) individual designated groupings having eight (8) transmit RF coils each should desirably be created—Or alternatively, four (4) individual designated groupings, each having four (4) transmit RF coils may be formed;

(iii) If the existing RF array contains thirty two (32) transmit RF coils in all, then two (2) individual designated groupings having sixteen (16) transmit RF coils each may be created—Or alternatively, four (4) individual designated groupings, each having eight (8) transmit RF coils may alternatively be formed—Or if one chooses, eight (8) individual designated groupings, each having four (4) transmit RF coils may be formed.

3. There is no upper numerical limit as to what shall be the selected number of multiple transmit RF coils that are to be collectively and cumulatively employed together as a single designated grouping or distinct subset of coils. However, in no operational instance or use circumstance shall that selected number of multiple transmit RF coils (constituting a single designated grouping) be greater than the actual number of existing independent transmission channels then available in the accessible MRI assembly or transceiver apparatus. This maximal limitation as to the selected number of transmit RF coils which shall constitute a single designated grouping is an absolute and inviolate rule of the instant method; and is a limitation which applies without exception and without regard to how many individual transmit RF coils are then present in total in the existing RF array.

Thus, for illustrative purposes only, the maximum number of multiple transmit RF coils constituting a single designated grouping is shown by the following:

(i) If the accessible MRI system contains only four independent transmission channels, then no single designated grouping of multiple transmit RF coils can or will exceed four (4) coils in number; and (ii) If the accessible MRI system contains only six (6) independent transmission channels, then no single designated grouping of multiple transmit RF coils can or will exceed six (6) coils in number; and (iii) If the accessible MRI system contains eight (8) independent transmission channels, then no single designated grouping of multiple transmit RF coils can or will exceed eight (8) coils in number.

4. Nevertheless, the concurrent guiding rule and controlling principle for achieving the most optimal method conditions is that there be a direct 1:1 ratio and uniform correspondence between the actual number of existing independent transmission channels (n) then available in the accessible transceiver apparatus and the selected number (m) of multiple transmit RF coils forming a single designated grouping of coils. Thus, it is again co-incidental that the optimal use conditions are identical to the practice which limits what is the maximum number of multiple transmit RF coils constituting a single designated grouping of coils.

5. There are several different ways to use the multiplexing effect and result caused by the use of all the available transmission channels concurrently in sequential series with each individual and distinct designated grouping of multiple transmit RF coils. Among them are the following:

(a) Pulsing the entire volume of prechosen designated groupings, also referred to as global excitation. This is used for simple pulses. These are typically preparation pulses to prepare the magnetization i.e. signal in a particular way (typically to generate contrast between tissues) prior to excitation and readout. Also used for 3D sequences.

(b) Single band slice selective excitation. In this mode, the pulses are applied solely to excite a single slice in the targeted living tissue. In this instance, in order to reduce power deposition, only those specific transmit RF coils in each designated groupings are pulsed which are spatially positioned to have a significant effect over the particular region of interest. This is most unlike the use of global excitation pulses—where when the multiplexing effect generates a sideband, the sideband will generate artifacts unless its positioned RF is placed outside the perimeter boundaries of the targeted object.

(c) As an alternative, a generated sideband can be used to create multiple bands of excitation (i.e., one RF pulse train excites multiple slices simultaneously). In this case, the information from multiple slices is de-convolved using the reception characteristics of the coils. Multiband excitation is conventionally known and has been described in detail in the literature, but has not ever been utilized in the context of multiplexing (i.e., by multiplexing, multiple excitation bands are automatically generated).

Thus, this multiband application is a significant advantage because (i) it decreases acquisition time since multiple slices (in this case up to m rows) are sampled at any time, i.e. an m fold increase in speed; and (ii) in comparison to conventionally exciting the entire sample which places the sidebands outside of the targeted object, the power is markedly reduced since only 1/m of the pulses are to be applied to the target.

(d) Finally, the manner in which the user divides and groups the total number of available transmit RF coils (which are pulsed simultaneously), along with the target spatial distribution of RF pulses, can substantially alter power deposition. This effect is the result of the user's ability to cancel the electric fields during simultaneous pulsing of the coils in one designated grouping, wherein the phase of the electric fields generated by the coils neutralize and cancel each other. When this effect is achieved, then the net electric fields generated during simultaneous transmission are markedly reduced,— which in turn, reduces tissue heating in-situ.

VIII. The Alternative Modes for Altering at Least One Characteristic Property in the Split Rf Pulse Flows The broad methodology constituting the subject matter as a whole prefers the altering of at least one characteristic property (and preferably several different attributes or traits together) of the RF pulse flows which are sequentially conveyed by the existing number of independent transmission channels to the multiple transmit RF coils in each of the different designated groupings of coils within the RF array. Note that the nature and degree of the performed alteration is such that the selected characteristic property becomes identifiably and substantively different from its original state— i.e., the characteristic attribute can be either qualitatively and/or quantitatively changed.

Accordingly, in order to achieve the desired changed result, the alteration of a characteristic property is at least one intentional and overt action selected from the group consisting of:

(i) Temporally concatenating the pulses forming the RF pulse stream, (ii) Interdigitating the electromagnetic waveforms forming the RF pulse stream, (iii) Changing the timing sequence of the pulses in the RF pulse stream, and (iv) Changing the selectivity of the electromagnetic waveforms forming a pulse in the RF pulse stream.

In performance and satisfaction of this manner of characteristic property change, it will be recognized and appreciated that each of the four individual modes of alteration listed above is different and distinct from all the others; that each of the four individual modes of alteration can be performed either alone in isolation or jointly in combination with one or more of the other acts, at the discretion of the user; and that all four individual modes of alteration can be cumulatively combined together and collectively employed at will, should the need or a desire to do so arise.

It will be appreciated therefore that in the preferred embodiments of the method, the alteration technique will be one of the different actions listed above; and, on most occasions, the alteration procedure will include two or more separate manipulations together in combination to achieve the desired result and effect. However, it is believed and expected that the performance of all four alterations actions together in a single technique will be a rare and unusual occurrence.

To insure that the intended user of the present methodology is able to utilize and perform to process effectively, a summary review of each mode of characteristic property alteration is presented below.

. . .

Alteration Mode 1: Temporally Concatenating the Pulses Forming the RF Pulse Stream By definition, to temporally concatenate is the act of joining or linking one or more pre-existing objects together as a chain. In meaningful effect and result, the overt action of temporally concatenating the pulses forming the RF pulse stream is the intentional linking of two or more individual pulses in the RF pulse stream together to form a novel stream of chain-linked pulses in series.

Accordingly, this aspect of the method and this particular mode of alteration may be generally implemented by performing the steps of:

linking a plurality of individual pulses in the RF excitation pulse stream together in time to form a novel stream of time-linked RF pulses, conveying said stream of time-linked RF pulses via the existing number of independent transmission channels to prechosen multiple transmit RF coils for a simultaneous transmission of $B_1$ magnetic field bursts; and causing each of the prechosen multiple transmit RF coils to transmit simultaneously a timed series of $B_1$ magnetic field bursts.

Implementation

The concatenated pulse uses complete RF waveforms which are delivered sequentially to the prechosen multiple transmit RF coils in two or more designated groupings of coils. The most common application for this construct will be for 3D imaging sequences which use non-selective (i.e. $2\pi\nu\tau$~0) pulses and low flip angle (i.e. $\theta$<0.1) excitation pulses.

Accordingly, this particular mode of alteration may be generally implemented by performing the following procedure:

First, one determines the amplitudes and phases of the RF pulses delivered to each coil in the RF pulse stream by optimizing the individual amplitudes and phases of each RF coil to achieve the desired spatial distribution of RF. As an example (illustrated by FIG. 2), a maximally homogeneous $B_1$ distribution over the human head was chosen.

The entire array of RF coils which are to receive the RF pulse stream are then grouped into separate sets of transmit RF coils for delivery of each RF pulse flow. In the example shown by FIG. 2 all 16 transmit RF coils were used to form the pulse stream; and the stream was divided into two flows, with each pulse flow corresponding to a single row of the two rows transceiver array—i.e., flow $RF_A$ includes RF coils 1-8, and flow $RF_B$ includes RF coils 9-16.

For a concatenated pulse, each split RF pulse flow receives output only once per application of the entire RF pulse train. In the 3D sequence shown in FIG. 2 a non-selective ($2\pi\nu\tau$~0) RF pulse of 5° (0.09 radians) was used.

The complete RF stream is then delivered by programming the MRI system to:

(1) Set the high power RF switch to connect RF coils associated with the first RF pulse flow to the available RF channels;

(2) Output the complete low angle RF pulse waveform using the phases and amplitudes determined for the RF coils in that RF pulse flow;

(3) Rapidly (e.g., 0.000001 seconds or less) change the state of the high power RF switch to connect the RF channels to the coils associated with the next RF pulse flow;

(4) Output the complete low angle RF pulse waveform using the phases and amplitudes determined for the RF coils in that RF pulse flow;

Thus, in the example illustrated by FIG. 2, after the RF train has completed, two dimensions of phases encoding and 1 dimension of a read out gradient are applied to form the image. In this example, two complete RF waveforms, i.e. 5° RF pulses were concatenated.

\* \* \*

Alteration Mode 2: Interdigitating the Pulses Forming the RF Pulse Stream

1. By definition, to "interdigitate" means to intermix the component parts of the whole object in a manner similarly to the interfolded or interlaced fingers of clasped or folded human hands.

Consequently, in the context of the present method, interdigitating the pulses forming a RF pulse stream is the act of intermixing individual and distinct RF segments from different RF pulse flows together in alternative arrangements and organizations such that an entirely new set of finger-like processes joined in series and a novel RF pulse stream is created. For RF pulse streams which do not satisfy the criteria that $\theta$>>0.1 and or $2\pi\nu\tau_k$~1, simple concatenation is not generally effective in achieving near equivalent performance to true simultaneous transmission and interdigitation is preferred. FIG. 3 shows a graphical representation where a non-selective 90° pulse is formed by interdigitating eighteen 5° pulses using either 2 (FIG. 3A) or 4 (FIG. 3B) RF pulse streams to drive a 16 (FIG. 3A) or 32 (FIG. 3B) RF coil array with 8 independent RF channels. This satisfies the requirement that $\theta_k$<0.1.

2. Frequency selective radio-frequency (RF) excitation pulses are ubiquitous throughout magnetic resonance imaging. They are widely used to either excite only those magnetic spins within a thin slice of tissue while leaving spins outside the slice or in alignment with $B_0$, the system's magnetic main field. This type of excitation is extremely useful because it simplifies the encoding stage of the MRI evaluation by permitting the system to record and reconstruct an image from only two dimensions of data. RF pulses that are not only able to excite a thin slice, but able to spatially-tailor the in-plane excitation (i.e., produce a varying in-plane flip angle) are also highly useful because they are able to reduce field of view (FOV) requirements in dynamic imaging applications, decrease susceptibility artifacts in functional MRI, and mitigate $B_1$ transmit profile inhomogeneity occurring at high field [Zelinski et al., IEEE TRANSACTIONS ON MEDICAL IMAGING, VOL. 27, NO. 9, SEPTEMBER 2008].

3. For a pulse sequence technique which employs frequency selective pulses, the effect of the pulse varies as a function of $\nu$, due to the intrinsic resonance frequencies of different compounds (magnetic resonance spectroscopy) or the spatial location of the nuclei during the application of pulsed field gradients (magnetic resonance imaging). To achieve selectivity, the RF pulses use waveforms where $\theta$, $\nu$ and $\phi$ can vary temporally, as shown in FIG. 4.

4. To generate the large pulse angle ($\theta \geq 0.1$) and/or long RF pulses ($2\pi\nu\tau_k \ll 1$) typically used for slice selective excitation, the slice selective pulse (illustrated in FIG. 4A) must be modified since it no longer satisfies the conditions for $\theta$ and $\tau$. To satisfy the criteria that $\theta_k < 0.1$ and $2\pi\nu\tau_k \ll 1$, the complete slice selective RF waveform is divided into I segments with each segment or time interval k satisfying the criteria that $\theta_k < 0.1$ and $2\pi\nu\tau_k \ll 1$. The I segments or time intervals for each RF pulse flow are then interdigitated to form the final RF pulse stream. FIG. 4B shows an example of how the frequency selective pulse shown in FIG. 4A is modified to create an interdigitated pulse. The two RF pulse flows which are delivered to different coil groupings are displayed in red and blue.

Implementation

Accordingly, this particular mode of alteration may be generally implemented by performing the following:

First, one determines the amplitudes and phases of the RF pulses delivered to each coil in the RF stream by optimizing the individual amplitudes and phases of each coil to achieve the desired spatial distribution of RF. As an example illustrated by FIG. 5, a maximally homogeneous $B_1$ distribution over the head was chosen.

The entire array of RF coils which are to be used in the pulse stream are then grouped into discrete sets of coils to deliver each pulse flow. In the examples shown by FIG. 5, 8 RF coils were used to form the pulse stream, and the stream was then divided into two RF pulse flows—with each RF pulse flow corresponding to 4 of the 8 RF coils in the 8 RF coil array (i.e., flow $RF_A$ includes RF coils 1-4, and flow $RF_B$ includes RF coils 5-8).

The RF waveforms used for selective excitation are typically applied in a $B_0$ field gradient to achieve spatial selectivity ($2\pi\nu\tau_k \ll 1$), and often have a relatively high net pulse angle ($\theta \gg 0.1$). The complete spatially selective RF waveform is then divided into multiple segments or time intervals such that the pulse angle of each segment or time interval k, is given by ($\theta_k < 0.1$, $2\pi\nu\tau_k \ll 1$) for the desired selection band.

The complete RF stream is then delivered by programming the MRI system to:

(1) Set the high power RF switch to connect RF coils in the first RF pulse flow to the available RF channels;

(2) Output $\tau_k$ seconds of the RF pulse waveform using the phases and amplitudes determined for the RF coils in that RF pulse flow;

(3) Rapidly (e.g., 0.000001 seconds) change the state of the high power RF switch to connect the RF channels to the coils in the next RF pulse flow, (4) Output the next $\tau_k$ seconds of the RF pulse waveform using the phases and amplitudes determined for the RF coils in that RF pulse flow;

(5) Repeat steps 1-4 as recited herein until the entire RF waveform has been delivered. In each repetition of this last step, the portion of the waveform being outputted is incremented by $n\tau_k$ seconds where n is the number of pulse flows (e.g., 2).

Thus, in the example shown in FIG. 5, after the RF stream has completed, one dimension of phase encoding and one dimension of a read out gradient are applied to form the image. The image shown in FIG. 5C was acquired using the sequence depicted in FIG. 5A, which uses two RF pulse flows and designated coil groupings of 4 RF coils each.

* * *

Useful Guidelines when Performing Alteration Modes 1 and 2

(i) Alteration modes 1 and 2 utilize two pulse flows to form the entire pulse stream. However as the number of RF coils in the array grows beyond double that of the number of the available transmission channels, additional pulse flows are needed to insure that all coils can output during a given pulse stream. Similarly, under some circumstances it may be desirable to increase the number of pulse flows so as to eliminate the simultaneous coherent addition of electric fields (which if equal quadruples the SAR) generated from coils which are included within a single RF pulse flow.

(ii) For Alteration Mode #1, this is achieved by repeating procedural steps 3 and 4 until all pulse flows have been applied. In each case, each pulse flow consists of the entire low pulse angle RF waveform. As a practical limit, the entire duration of the pulse stream, $n\tau$ (where n is the number of pulse flows, and $\tau$ is the duration of the RF pulse flow) should be less than much less than $\frac{1}{2\pi\nu}$ (where $\nu$ is the frequency of resonances which are to be measured).

(iii) For Alteration Mode #2, additional pulse flows can be added to the pulse stream by repeating steps 3 and 4 until all RF pulse flows have been applied and then repeating procedural steps 1-4 until the entire RF waveform has been applied.

(iv) The number of pulse flows which can be practically included in a single RF pulse stream is limited by the selectivity of the entire pulse stream. Specifically, for a fixed duration of the RF selective pulse, the total duration of the all RF pulse flows is limited to the same value. Thus each of the n individual RF pulse flows is only applied for 1/nth of the duration.

As the total duration of an individual RF pulse flow decreases the number of segments I in that pulse flow also decreases for a fixed duration segment $\tau_k$. This in turn increases the pulse angle for each segment $\theta_k$. Although in principle $\tau_k$ can be arbitrarily short to increase the number of segments and maintain $\theta_k < 0.1$, the proportion of time expended to change the state of the RF switch ("dead time") as a fraction of the total time grows. This requires increased RF pulse flow amplitude to compensate for the "dead time" of the switch when no RF output is occurring.

Finally, even in the presence of an infinitely fast switch, (i.e. a dead time of zero) the decreased overall duration of each pulse flow will also require a proportional increase in RF pulse flow amplitude. This will generally result in an increase in SAR.

* * *

Alteration Mode 3: Changing the Timing Sequence of the RF Pulses in the Stream to be Conveyed to the Transmit RF Coils To generate large pulse angles and long pulse durations used for selective pulses, the desired waveforms are divided into I segments such that $\theta_k < 0.1$ radians (see FIG. 4A) for any segment and the RF pulse flows to different channels are interdigitated (see FIG. 4B). FIG. 4 compares the transverse magnetization from an interdigitated pulse (see FIG. 4C, red circles) and the corresponding true simultaneous 90° sinc excitation pulse (see FIG. 4C, blue line). The interdigitated pulse shows a nearly equivalent main band of excitation, and additional sidebands generated at $1/n\Delta\tau$.

In this example, $\Delta\tau$ is the sum of the duration of a single RF pulse segment applied to one group of coils, $\tau_k$, and the switching time for the RF switch. The value of n is given by the number of pulse flows. The generated sidebands occur spatially where the coils in one of the RF pulse flows generate minimal RF. The position of the generated sidebands can be placed outside of the FOV of the object by adjustment of the time interval $n\Delta t$.

Although each RF pulse flow waveform is a sinc, the amplitudes and phases applied to different coils (red versus blue) within the same pulse flow but using different channels and for coils in different pulse flows using the same RF channel are not equivalent and relative differences vary according to which coils are paired, reflecting the difference in phase and amplitudes required for different coils around the array and target $B_1^+$ distribution.

* * *

Alteration Mode 4: Changing the Selectivity of the RF Streams to be Conveyed to the Transmit RF Coils As described in Alteration Mode #3 above, the interdigitated slice selective waveforms generate sidebands at $n\Delta\tau$. To eliminate these sidebands, the timing of the RF pulse flows can be modified to place the sidebands spatially outside of the object, resulting in near equivalent selectivity as a RF pulse applied simultaneously to all coils.

In addition, the selectivity of the waveform can be similarly modified to create multiple bands of excitation using larger values of $n\Delta\tau$, which place the sidebands within the boundaries of the targeted object. Simultaneous excitation of multiple bands within the object allows images and information to be acquired from multiple slices at the same time. This can be used to decrease the acquisition time by reducing the total number of excitations or RF pulse streams required.

In a similar manner, reducing the total number of excitations or RF pulse trains applied per time interval also reduces the power deposition due to the use of fewer RF pulse streams. In this alteration, each RF pulse train excites multiple spatial slices which are then acquired simultaneously.

The data acquired from multiple slices can be de-convolved using the spatially varying sensitivity of the RF coils in the array. For example, an RF pulse train which excites two slices (one predominantly within the first row and one predominantly within the second row), can be resolved based on the amplitude and phase of the signal in received by the coils in each of the rows.

IX. Achieving an Effective Equivalent of a Simultaneous Transmission of a $B_1$ Magnetic Field The major achievement and value of the present methodology is the capability to achieve the effective equivalent of a true simultaneous transmission of $B_1$ magnetic field pulse to a targeted living tissue or a particular region of interest—given the structural limitations of an existing MRI system assembly or transceiver apparatus wherein a lesser number of independent transmit channels are in operative communication with a greater number of individual transmit RF coils in an RF array. The present invention is thus able to effect a marked improvement in operational quality and in functional capacity; as well as provide a simple to employ procedure which greatly enhances and substantially expands the operational parameters and clinical applications of the existing MRI system in a manner which was not believed to be possible previously.

In order to demonstrate and evidence the unexpected quality and unforeseen degree of differences provided by the present method, the following informational details are offered.

Homogeneously Exciting the Entire RF Transmission Array

Imaging sequences such as FLAIR, MP RAGE, MTI and all 3D sequences utilize sequentially delivered RF excitation pulse streams which are intended to uniformly affect the targeted living tissue, such as the entire human head. For a 16 coil transceiver array and an 8 channel transmit system this requires the use of at least 2 RF pulse flows delivered to at least two designated groupings of coils. For the two designated groupings each formed as a multiple 8 transmit RF coil row, it is necessary that the $B_1$ distributions generated by each designated grouping of transmit RF coils be complementary and "stitched" together to form a homogeneous distribution of $B_1$ magnetic field bursts. The presence of this capability is empirically demonstrated by FIG. 7 herein.

Attention is initially directed to FIGS. 6 and 7 as a whole which shows multiplexed RF and multi-slice imaging using two different (8 coil×2 row) designated groupings. FIG. 7A displays a schematic of the hardware configuration used where 8 independent RF channels are used to drive 8 independent RF amplifiers and a high speed switch alternately conveys the output of those RF amplifiers to RF coils in the two rows of the array. In this the two RF pulse flows (red and blue arrows) are conveyed to RF coils 1-8 and RF coils 9-16 respectively. FIG. 7A shows $B_1$ maps for multiplexed transmission; FIG. 7B shows a multiplexed inversion recovery sequence; and FIG. 7C shows inversion recovery images acquired via the sequential delivery of individual RF pulse flows.

Thus, as shown therein, FIG. 7A displays a series of scout images, ROIs used for 3D optimization and $B_1$ maps after optimization. These maps were acquired using identical amplitudes and phases for each slice, and thus is a demonstration of the ability to uniformly excite the brain. Below each map, the mean $B_1$ and standard deviation over the entire brain within the slice is listed (green ROI). Note also that, after pooling the ROIs from all 7 slices, the standard deviation was less than 15%.

FIGS. 7B and 7C display a multiplexed multi-slice inversion recovery sequence and data acquired with this sequence using the 8×2 array. Contrast and $B_1$ is maintained from the top of the head to the top of the temporal lobes. In this example, $n\Delta\tau=20$ us, such that the sidebands are at $\pm 50$ kHz, and lie outside of the sensitive volume of the coil.

Multiplexing and SAR

As described previously above, FIG. 7 illustrates the ability to multiplex RF pulse flows using two different designated groupings of multiple transmit RF coils to achieve good global excitation (each row of 8 transmit RF coils being a single designated grouping in a RF array having a two row organized arrangement of 16 RF coils).

However, there are also a variety of alternative ways in which the different subsets of multiple RF coils can be grouped which differ according to which particular collection of individual transmit RF coils are desired or required to be driven together simultaneously. For example, one can drive RF coil nos. 1-8 together as a first designated grouping and then subsequently drive RF coil nos. 9-16 together as a second designated grouping, as shown in FIG. 6 and FIG. 7; or alternately, one can drive all the existing odd numbered coils collectively as one discrete subset of coils, and then subsequently drive all the even numbered RF coils collectively as another different subset of coils. In many use instances, the particular choice of which transmit RF coils are included in a coil group for simultaneous excitation during a single RF pulse flow can have a significant impact on the spatial distribution of SAR. This issue is demonstrated by FIG. 8 as a whole.

As presented therein, FIG. 8 shows a series of simulated and measured amplitude and phase relationships. In particular, FIG. 8A shows a homogeneous distribution for the entire RF transceiver array; FIG. 8B shows a single coil; and FIG. 8C shows a ring distribution for the entire RF transceiver array.

Thus, when driving a homogeneous distribution from a single row of grouped transmit RF coils (the phase shift per coil ~45°—see FIG. 8A), the transceiver RF array achieves its in-plane homogeneity by cancelling up to 60% of the $B_1$ at the surface of the object or human head, (i.e., the efficiency $\eta B_1 \approx 0.4$), while constructively adding the $B_1$ values in the center of the object or head, $\eta B_1 \approx 1$).

Due to the symmetry of the dominant component of the E field (i.e., a 180° phase shift at the mid-line of the coil in the axial plane, see FIG. 8B—bottom)—this phase distribution also results in cancellation of the E field at the periphery of the head reducing local SAR. Notably, for transceiver RF arrays using homogeneous $B_1$ distributions, SAR is maximal at the periphery of the head or sample (see FIG. 8A). Thus, to minimize the maximal values of SAR within the head, homogeneous distribution should be driven by grouping RF coils within the row for simultaneous transmission.

Conversely, for the ring distribution used for $B_1$ shimming based outer volume suppression for MRSI, (see FIG. 8C), the phase relationship used ($\approx 180°$ phase shift per RF coil) results in constructive $B_1$ interference at the periphery and in destructive $B_1$ interference at the center (this pulse is used to excite peripheral regions). In this case (as seen in FIG. 8C), the E-fields at the periphery are also constructive ($\eta E \approx 1$).

Note also that, although the overall power required to drive an equivalent $B_1$ value at the periphery of the head is a factor of 6 lower than that for the homogeneous distribution, the maximum local SAR generated is nearly identical. In this case, adjacent coils within the RF array should not be driven simultaneously when multiplexing, but instead be grouped alternately—thereby reducing constructive E field generation ($\eta E$) at the periphery.

To demonstrate this point a comparison was made of the increase in temperature (measured by $B_0$ shift) associated with applying a multiplexed waveform with true simultaneous transmission for an 8×1 array, the results of which are shown by FIG. 9.

As a whole, FIG. 9 illustrates SAR and multiplexing for the ring distribution. Specifically, FIGS. 9A and 9B are schematic illustrates of sequences (top-conventional, bottom multiplexed) and coil groupings; FIG. 9C shows the measured $B_1$ map for ring distribution; FIG. 9D shows a calculated efficiency of E field (red=1.0, blue=0.0) and heating maps in degrees for 30 W continuous application of RF for 5 minutes for conventional (FIG. 9E) and multiplexed (FIG. 9F) formats.

The evidence of FIG. 9 reveals that, despite the doubling of the amplitudes for the multiplexed waveform, the measured heating was nearly identical to true simultaneous transmission. Thus, a careful choice of which RF coils are to be grouped together as a designated grouping for an RF pulse flow can have a significant effect on the maximum local SAR.

X. Preferred Techniques for Practicing the Unique Method

In order to appreciate better the broad methodology comprising the present invention, a variety of different procedures is presented below as a series of exemplary and preferred techniques which can be performed and utilized advantageously. However, it is expressly understood that each exemplary and preferred technique described below typically employs at least one (and more typically two or more) identified mode of characteristic alteration; and that in general different combinations of the described individual modes of characteristic alteration are frequently desirable. Accordingly, it is the user's particular needs or the specific requirements of the individual application that will ultimately dictate and decide which mode(s) of characteristic alteration shall be chosen and performed.

Exemplary Technique 1: A Pulse Sequence Technique Using Non-Frequency Selective Pulses To overcome the three primary complications described in detail above, RF pulse sequence transmissions [$I_0 \rightarrow I_f$, where $I_0$ and $I_f$ are the initial state and final states of the spin system] whose overall performance and effect are virtually equivalent to a true simultaneous transmission of excitation RF signals can be achieved by temporally concatenating and/or interdigitating the RF pulse stream.

In this preferred technique, a single coherent RF pulse stream (or pulse interval for pulses with temporally varying $B_1$, $\phi$ and $v$) is subdivided into two or more separate and distinct RF pulse flows; and each of the discrete RF pulse flows are individually applied sequentially and in series to different prechosen subsets or designated groupings of multiple transmit RF coils in the RF transmission array.

As merely one representative illustration, a single original RF pulse stream intended for a RF transmission array formed of 16 independent transmit RF coils (numbered 1-16) is split into two separate and distinct sequential pulse flows—with the first sequential RF pulse flow being applied solely to transmit RF coils 1-8 and the second sequential RF pulse flow being subsequently applied only to transmit RF coils 9-16 (see FIG. 2).

It is noteworthy also that, as long as the overall rotation during any single individual pulse interval or step is small (i.e., $\theta_k$ is small), the net effect on the spin system of the targeted living tissue will be very similar to that seen for the application of a single simultaneous pulse stream. This overall result can be demonstrated by comparing the effect of two arbitrary sequential RF pulse flows (see Equation 3 below) with the effect of the original single RF pulse stream when applied simultaneously (see Equation 4 below).

$$I_f = \{(\phi_2 I_z)(-\alpha_2 I_y)(\theta_2 I_x)(\alpha_2 I_y)(-\phi_2 I_z)(\phi_1 I_z)(-\alpha_1 I_y)(\theta_1 I_x) \\ (\alpha_1 I_y)(-\phi_1 I_z)\} I_0 \quad \text{(Equation 3)}$$

$$I_f = \{(\phi I_z)(+\alpha I_y)(\theta I_x)(\alpha a I_y)(-\phi I_z)\} I_0 \quad \text{(Equation 4)}$$

Accordingly, for non-selective pulses where $B_1 < \geq v$, i.e. $\alpha \approx 0$ and setting $\phi_1 = 0$, then $\theta = (\theta_1^2 + \theta_2^2 + 2\theta_1\theta_2 \cos(\phi_2))^{1/2}$ and $\phi = \tan^{-1}(\theta_2 \sin(\phi_2)/(\theta_1 + \theta_2 \cos(\phi_2)))$.

In addition, for $\theta_1$ and $\theta_2 < 0.1$ radians for any $\phi_2$, the values of individual elements of the final 3×3 rotation matrix differ by less than $5 \times 10^{-3}$ for the two separate and distinct sequentially delivered RF pulse flows pulses using the same transceiver RF transmission array. Moreover, when used as an excitation RF signal, the maximum difference in transverse magnetization is less than 0.2%. Thus for 3D imaging acquisitions using low angle $\theta \sim 5$ degrees (0.09 radians), non-selective pulses, $\alpha \approx 0$, the waveforms to groups of coils can be simply concatenated (see FIG. 2A).

It will be noted also here that FIG. 2A illustrates a pulse sequence showing the RF pulse being applied to transmit RF coils 1-8 (red $RF_A$) and 9-16 (blue $RF_B$) and is sequentially followed by phase encoding gradients (green Gx,Gy) and a read out gradient (Gz). M samples are acquired during each readout and this is repeated N×P times while the phase encoding gradients are incremented to generate a M×N×P 3D image. FIG. 2B shows the 3D image acquired using the single row 8 coil transceiver array. FIG. 2C shows the 3D image acquired using 16 coil (two rows of 8 coils each) elliptical transceiver array.

Due to the minimal phase precession during the pulse, coherent excitation is maintained where the $B_1$ fields of the transmit RF coils overlap. Displayed in FIGS. 2B and 2C are sagittal images from a 3D data set using 8 transmit channels to drive an 8 RF coil transmission array (a true simultaneous transmission effect—see FIG. 2B, from the RF coils shown in FIGS. 1A & 1B) or a 16 element array (concatenated waveform—see FIG. 2C, from the RF coils shown in FIGS. 1C & 1D).

In this instance, transmit channels 1-8 drive a first designated grouping of transmit RF coils 1-8 simultaneously; and only afterwards in timed sequence, then drive a second designated grouping of transmit RF coils 9-16 simultaneously. Note the absence of image artifacts for the region between the two designated subsets of RF coils (corpus callosum), as well as the increase in spatial coverage for the entire 16 RF coil transmission array.

Also note that in the schematic, the amplitude of the pulses is equivalent. However, in actual practice (and in this example), the amplitudes and phases of the RF pulses will differ based on the transmit RF coils' structural geometry, location and desired effect, and targeted spatial distribution of the RF pulse.

Illustrative Variants of the 1$^{st}$ Exemplary Technique

These variants demonstrate how the multiplexing technology can enable the use of non-selective pulses with pulse angles θ>0.1 radians to be used in imaging sequences with an arbitrary number of transmit coils and RF channels. Initially, attention is respectfully directed to FIG. 3. As seen therein, FIG. 3A shows a pulse sequence for 3D imaging using a 90 degree excitation pulse, constructed by interdigitating transmit RF coils 1-8 with eighteen 5 degree pulses to pulses being delivered to transmit RF coils 9-16. FIG. 3B shows an equivalent pulse sequence to FIG. 3A, but uses 32 transmit RF coils and interdigitates the pulses then sent separately to four designated groupings formed of 8 transmit RF coils each.

Variant Technique 1A:

For sequences which use pulse angles greater $\theta_{tot}$>0.1 radians, the pulses can be broken down into multiple segments (k=1 ... n) with the individual $\theta_k$'s being less than 0.1 radians (see FIG. 3A). For example, a 90 degree non-selective excitation pulse can be split into n=18 intervals with pulse angles of $\theta_k$=5 degrees each. Under these conditions for a maximum value of $\theta_{1k}$ and $\theta_{2k}$<0.1 for any $\phi_2$ the maximum absolute difference transverse magnetization created (i.e. excitation) by simultaneous pulse versus the equivalent sequential pulse is 0.014. For comparison purposes, a 90 degree excitation yields transverse magnetization of 1.0.

Variant Technique 1B:

For pulse sequences using larger numbers of transmit RF coils, increasing numbers of pulses (sent to different transmit RF coils) can be concatenated. For example, a 32 transmit RF coil array can be split into 4 designated groupings, each of which is constituted of 8 different transmit RF coils (see FIG. 3B). The 8 transmit RF coils in each individually designated grouping are driven simultaneously, while the pulses sent to each of the different designated groupings of coils are interdigitated.

In principle therefore, this technique variant can be extended to any arbitrarily chosen number of separate designated groupings of transmit RF coils, with the true number of transmit RF coils within any one designated grouping being limited by only the number of independent transmit channels then existing in the transceiver apparatus.

Exemplary Technique 2: A Pulse Sequence Technique Using Frequency Selective Pulses For a pulse sequence technique which employs frequency selective pulses, the effect of the pulse varies as a function of ν, due to the intrinsic resonance frequencies of different compounds (magnetic resonance spectroscopy) or the spatial location of the nuclei during the application of pulsed field gradients (magnetic resonance imaging). To achieve selectivity, the RF pulses use waveforms where $B_1$, ν and ϕ can vary temporally.

In practice, these waveforms are applied as a series of discrete steps—such that $B_1$, ν and ϕ are constant during any single step, but vary from step to step. Similar to that described above for the 90° non-selective pulse, the pulse waveform for the frequency selective pulse can also be interdigitated so as to act upon multiple independent RF coils.

Attention is respectfully directed to FIG. 4. As seen therein, FIG. 4A is a conventional sinc waveform; FIG. 4B is a sinc waveform in which the red and blue RF segments are sent to different RF coil groupings representing two RF pulse flows. In this example the red RF segments make up a first RF pulse flow and are applied to coils in a first designated grouping of RF coils while the blue RF segments make up a second RF pulse flow and are sent a different grouping of RF coils. The RF segments making up two different RF pulse flows are interdigitated temporally to create the complete RF pulse stream. FIG. 4C is a plot of the transverse magnetization (vertical axis) versus frequency offset (ν) for simultaneous excitation for simultaneous excitation (blue line) or interdigitated excitation (red circles) where one group of coils has 0 amplitude.

Displayed in FIG. 4A is a conventional sinc pulse, which is commonly used for frequency selective excitation along with its interdigitated equivalent using two RF pulse flows (see FIG. 4B). In this pulse, the amplitude of the pulse, $B_1$, varies according to $B_1(x)=\sin(x)/x$; $x=-2\pi ... 2\pi$. The continuous $B_1$ function is mimicked by dividing it into many RF segments during which the $B_1$ is constant. During each interval the angle, $\theta_k=B_1\tau_k$. If and when applied in a pulsed field gradient applied in the z direction, the frequency of any given location in the targeted sample is given by ν=ΔzGz, where Δz is the distance in the z direction from the magnetic center of the gradient system in cm, and Gz is the strength of the gradient in Hz/cm. To achieve performance virtually equivalent to simultaneous transmission, the requirement that $\theta_k$<0.1 radians remains and is augmented by the condition of minimal net precession in the transverse plane.

In this instance, $2\pi\nu\tau_k$ must be small during each pulse, where $\tau_k$ is the duration of an individual RF segment (i.e., the time needed to apply one step of the pulse). Notably, at $2\pi\nu N\tau_k=1$ (N is the number of groups of coils being interdigitated), the pulse will generate a sideband of excitation (see FIG. 4C) when the $B_1$ fields generated by the different coils are markedly different (e.g., $B_1$ from one group is zero). Notably if the region where $2\pi\nu N\tau_k=1$ is outside of the sample or the total $B_1$ is very weak, the sideband of excitation will be ineffective in producing signal and may be ignored.

Exemplary Technique 3: A Sequence Procedure Using Adiabatic Pulses

When nuclear magnetic resonance (NMR) was first performed, resonance was achieved by continuously sweeping the amplitude of the polarizing magnetic field $B_0$ in the presence of a perpendicular $B_1$ magnetic field which oscillated at a constant radiofrequency. This continuous wave (CW) approach has since been replaced by the pulsed stream approach, which is performed in a static $B_0$ field and uses a stream of $B_1$ field pulses to excite the full band of spectral frequencies simultaneously.

These frequency-swept pulses are known as adiabatic pulses; and have benefited from recent advances in technical knowledge which have expanded their capabilities and popularity in applications ranging from in-vivo imaging to high resolution spectroscopy of targeted molecules.

Furthermore, in analogy to the classical CW approach, the different spectral components are rotated in succession during the adiabatic frequency sweep. When the total sweep time is short relative to $T_1$, the transient response of the spin system can be induced, which allows observation of NMR phenomena (e.g. FIDs or echoes) related to the pulse stream procedure. By rapidly sweeping the frequency of the adiabatic pulses, NMR evaluations and analyses can be performed in the same manner as the RF pulse stream procedure (i.e. the length of the adiabatic pulses can be short enough to permit their use in most pulse streams). In this manner, the advantages of both classical CW and pulsed NMR approaches can be advantageously exploited.

Adiabatic pulses are also commonly used for selective excitation of targeted living tissues, and have the unique property of achieving equivalent spin perturbation over a broad range of $B_1$ field strengths. Adiabatic pulses are constructed using continuous functions for amplitude ($B_1$), and either phase ($\phi$) or frequency ($v$). Simultaneous transmission by multiple transmit RF coils as the consequence of these adiabatic pulses can also be mimicked effectively by interdigitating the electromagnetic waveforms in each adiabatic pulse of the stream.

Attention is therefore respectfully directed to the data presented by FIG. 5 as a whole. The illustrations and information presented by FIG. 5A shows a pulse sequence depicting a multi slice gradient echo imaging sequence using an inversion pulse and delay TIR, to generate tissue contrast. The sequence uses a spatially non-selective adiabatic inversion) (180°) pulse and a spatially selective excitation pulse (30°). For each application of the inversion pulse, N slice selective excitations are applied to generate N slices in the image. The spatially non-selective adiabatic inversion pulse is generated dividing the conventional RF pulse into I RF segments each retaining its typical values of $\phi$, $v$ and $B_1$.

The pulse is then recast using two RF pulse flows (red $RF_{180A}$, blue $RF_{180B}$) which are applied to RF coils 1-4 and 5-8 respectively, as shown by FIG. 5A. The overall phase and amplitude scaling for the individual RF pulse flows are now adjusted to include the optimal phases and amplitudes determined from RF shimming. The two pulse flows are then interdigitated to form a single RF pulse stream. The inversion pulse is followed by a delay period TIR to provide image contrast. The slice selective excitation pulses are formed in a similar fashion, with the exception that the waveform is a sinc.

Note that the pulses $RF_{30A}$ and $RF_{30B}$ shown by FIG. 5A are applied in a gradient (Gz) to provide slice selection. Each slice selective excitation pulse is followed by a phase encoding gradient (green Gy) and a read out gradient (Gx). M samples are acquired during each readout gradient (Gx) for each of the N slices. The phase encoding gradients are incremented with each application of the inversion pulse to generate N M×P images.

For slice selective imaging sequences or sequences using adiabatic pulses, in satisfaction of the criteria listed above, the electromagnetic waveforms conveyed to different designated groupings of transmit RF coils are to be interdigitated (see FIG. 5A). With short inter-pulse intervals ($2\tau_k$=20 us), the sidebands of excitation and inversion (50 kHz) can be placed outside of the sample or spatial envelopes of the transmit RF coils.

In this instance, an 8 coil transceiver array and 8 independent transmit channels was used. Please recognize that this use instance directly compares simultaneous transmission to all 8 coils to that achieved using interdigitated transmission of four independent channels and amplifiers driving two groups of four coils simultaneously (RF coils nos. 1-4 or RF coil nos. 5-8). Accordingly, FIG. 5B displays an axial image acquired using a simultaneous transmission to all 8 RF coils; and FIG. 5C displays an axial image acquired using its interdigitated equivalent (i.e. the pulse sequence shown in FIG. 5A). Attention is particularly directed to the fact that the two individual axial images shown by FIGS. 5B and 5C respectively are virtually indistinguishable.

An Illustrative Variant Technique Format

For multi-slice imaging, it should be noted that when the $B_1$ field over the selected slice is dominated by one designated grouping of transmit RF coils, such that the second designated grouping of transmit RF coils has minimal effect, the stream of excitation RF pulses to the second group of coils can be omitted with negligible impact in pulse sequence outcome. Under these conditions, the power deposited to the targeted sample will be decreased.

Thus, in a one representative illustration, for the 16 coil transceiver array shown by FIGS. 1C &1D when employed for axial orientations (e.g. FIG. 7), only in the region adjacent and in between both of the two individual rows of transmit RF coils will it be necessary to interdigitate two RF pulse flows to generate the complete RF pulse stream used for slice selective excitation. This difference can effectively eliminate the complication arising from unwanted sidebands (see FIG. 4C). Also, owing to the improved efficiency for short RF coil arrays, this will reduce the power required in comparison to longer (double the length) single rows of transmit RF coils in the transmission array.

Exemplary Technique 4: A Technique for Controlling Power Deposition

Conventionally, when RF waveforms are applied to living tissue samples such as the human body, tissue heating in-situ typically occurs. The tissue heating is due to the electric field component of the applied RF waveforms forming each pulse; is proportional to the square of the amplitude of the instantaneous electric field; and is linearly dependent upon its duration and electrical properties of the tissue.

Also as conventionally known, when all the transmit RF coils within a transmission array are all used simultaneously to generate a $B_1$ magnetic field, the electric fields from the individual transmit RF coils constituting the entire transmission array cumulatively add together as vectors to provide the net electric field. Thus, two electric fields (from individual transmit RF coils) which are coherent—i.e., have the same phase and amplitude—will double the electric field strength and increase the power by a factor of 4.

However, the same two RF pulses applied sequentially to individual transmit RF coils for generation of a $B_1$ magnetic field will only increase the deposited power by a factor of 2—i.e., they have the same instantaneous amplitude, but twice the duration. Thus the power deposited and tissue heating resulting from sequentially conveyed RF pulses to two transmit RF coils of equivalent duration and amplitude will not generally be equivalent to a simultaneous conveyance of a single RF pulse to both transmit RF coils.

In the case where the electric fields are constructive (i.e., they have identical phases), use of two sequentially conveyed RF pulses reduces the total power deposition by a factor of two in comparison to conveyance of a single simultaneous pulse. Conversely, when the electric fields are of opposite phase (destructive interference), simultaneous transmission reduces power deposition by decreasing the instantaneous electric field strength—while sequential application of the pulses yields a linear addition of their respective power deposition. Thus, depending upon the phase relationship of the individual RF pulses and the electric fields generated by the individual transmit RF coils, interdigitated transmission—as opposed to simultaneous transmission—can significantly reduce tissue heating where the electric fields generated by the individual coils show constructive interference.

Notably also, if the individual transmit RF coils occupy different spatial locations in the existing transmission array, this event will modify the overall pattern of tissue heating in the object. Further, the extent of heating may be modulated by judiciously considering and choosing which particular coil locations are within the purview of any one designated grouping of transmit RF coils, all of which are excited simultaneously as a group as a single RF pulse flow.

Attention is also respectfully directed to entirety of FIG. 10, wherein FIG. 10A is a $B_1$ map for homogeneous excitation; FIG. 10B is a corresponding electric field map; FIG. 10C is a configuration to minimize heating when using interdigitated excitation to generate a homogeneous $B_1$ distribution (red coils group 1, blue coils group 2); FIG. 10D is a $B_1$ map for the ring distribution where only the surface is excited; FIG. 10E is a corresponding electric field map; and FIG. 10F is a configuration to minimize heating when using interdigitated excitation RF pulses (red coils group 1, blue coils group 2) for the ring $B_1$ distribution.

An intentional designation and purposeful grouping of individual transmit RF coils (then present in the transmission array) which have a high degree of destructive electric field interference into separate identifiable subsets of coils will tend to reduce the amount of heating for a given pulse (see FIG. 10C). In these instances, the choice of individual phases and amplitudes for the RF pulses applied to each transmit RF coil in a single designated grouping produces a relatively homogeneous $B_1$ distribution, and results in electric fields which experience destructive interference at the surface of the sample (see FIG. 10B).

Thus to minimize tissues heating, when one uses interdigitated pulses for the homogeneous distribution; adjacently located transmit RF coils should be kept together within the same single designated grouping (see FIG. 10C). Conversely, if the phases chosen to drive every other transmit RF coil are shifted by 180 degrees as in the ring distribution which excites only the surface, the $B_1$ (see FIG. 10D) and electric fields (see FIG. 10E) from adjacently located transmit RF coils will be constructive at the surface and destructive in the center of the living tissue sample.

Although the waveform amplitudes of RF pulses and the $B_1$ field used in FIGS. 10A & 10B and FIGS. 10D & 10E were identical, the phases selected result in a dramatically enhanced $B_1$ field and electric field strengths at the tissue surface (seen in FIGS. 10D & 10E); and cause a reduced $B_1$ field and electric field strengths in the interior of the living tissue. Therefore, to minimize power deposition and tissue heating at the surface for the distribution (as shown in FIGS. 10D & 10E), adjacently located transmit RF coils should be in separate and different designated groupings of coils (see FIG. 10F).

XI. A Unique Apparatus for RF Pulse Interdigitation

To achieve interdigitation, the RF excitation pulse flows must be rapidly routed to different individual transmit RF coils lying within separated and different designated grouping of coils. Using the instance and application circumstances illustrated by FIGS. 6 and 7 above, each of the sequentially delivered split RF excitation pulse flows is individually applied and conveyed in timed intervals of $10 \times 10^{-6}$ seconds to each of the separate and distinct designated groupings of RF coils (the transmit RF coils in designated grouping A being Nos. 1-8 and the transmit RF coils in designated grouping B being Nos. 9-16)—with an entire sequential delivery cycle therefore occurring every $20 \times 10^{-6}$ seconds.

Since the output from a single transmit channel and its corresponding RF amplifier must drive two transmit RF coils (e.g., transmit channel 1 drives RF coils 1 and 9), a switch must be used to route the output of the RF channel and amplifier to the appropriate coil. Thus, switching times must be very fast relative to the duration of an individual RF segment; typically with switching speeds of below $1 \times 10^{-6}$ seconds It will also be noted and appreciated also that the true critical parameter for the RF switch is the switching speed—i.e., the time required to change state. The duration which it is in a particular state, although important for the routing sequence, is not a relevant parameter or meaningful criteria as such for the RF switch.

Furthermore, for RF arrays having a larger number of independent RF coils (e.g., 16-32 transmit RF coils), the RF switch must be capable of routing the output the RF transmission channel and its corresponding amplifier to two (2) or more individual transmit RF coils in different designated groupings. Thus, as the number (N) of possible destination transmit RF coils for the RF switch increases, maintenance of the requirement that $2\pi\nu N\tau_k < 1$ requires an ever-increased switching speed.

Such rapid switching can be achieved by the use of PIN diodes and tuned circuit elements. To illustrate this point, FIG. 6 schematically shows the use of 16 transmit RF coils in an existing transceiver array which are being driven with 8 independent RF transmission channels and amplifiers.

In this illustration and instance, RF transmission channel #1 drives RF amplifier #1—which is used alternatively to drive either transmit RF coil #1 or transmit RF coil #9. Similarly, RF transmission channel #2 is used to drive RF amplifier #2—which alternatively drives transmit RF coil #2 or transmit RF coil #10.

Accordingly, the unique apparatus for interdigitation of RF pulses may be defined as:

In a conventional transceiver apparatus structurally comprising (α) means for producing a RF pulse stream on-demand;

(β) a fixed but lesser number of independent transmission channels, each of said transmission channels being able to convey the produced RF pulse flow to each of the independent transmit RF coils in the RF transmission array; and (γ) at least one discrete RF transmission array comprised of a fixed but greater number of transmit independent RF coils, each said transmit RF coil being able to generate a $B_1$ magnetic field as a series of radiofrequency magnetic field bursts having predetermined spatial and temporal amplitude and phase characteristics, and to transmit the generated $B_1$ magnetic field bursts to a targeted living tissue then lying within a $B_0$ magnetic field having a strength not less than about 3T;

the improvement comprised of:

means for splitting the produced RF excitation pulse stream into not less than two separate and sequentially deliverable RF pulse flows, each of which can be individually conveyed and delivered in sequential sequence via the existing number of independent transmission channels to the multiple transmit RF coils present within different designated groupings of coils in the RF array; and a rapid-speed routing switch able to direct and collectively convey in sequential series a plurality of discrete RF pulse flows from the existing transmission channels to the multiple transmit RF coils present within different designated groupings of coils in the RF array for separate and concurrent transmissions of $B_1$ field bursts to a targeted living tissue.

Alternately, for systems having an equivalent number of RF amplifiers as transmit RF coils in the RF array, but also having a smaller number of transmission channels than transmit RF coils, the RF switch may be deployed after the transmission channels but before the RF amplifiers. A schematic of this organizational scheme is shown in FIG. 6B. In this organizational scheme, the output from each transmission channel would be individually directed by the RF switch to one of several RF amplifiers, with each RF amplifier driving a single transmit RF coil in the existing RF array.

The present invention is not restricted in form nor limited in scope except by the claims appended hereto:

What we claim is:

1. A method for generating an effective equivalent of a simultaneous transmission of excitation RF signals to a targeted living tissue disposed within a moderate to high strength magnetic field for magnetic resonance imaging, said method comprising the steps of:

accessing a MRI assembly able to produce electromagnetic waveforms as a RF excitation pulse stream on-demand using a plurality of independent transmission channels which are in operative communication with multiple individual transmit RF coils in a RF array for the conveyance of a RF excitation pulse stream, wherein the total number of independent transmission channels is measurably fewer than the total greater measurable number of individual transmit RF coils within said RF array;

dividing the total greater measurable number of individual transmit RF coils within said RF array of said MRI assembly into a plurality of designated groupings, wherein each of said designated groupings constitutes a determinable portion of the total measurable number of individual transmit RF coils within said RF array;

producing a RF excitation pulse stream within said MRI assembly for conveyance by the measurably fewer number of independent transmission channels to the measurable greater number of individual transmit RF coils in said RF array;

splitting said produced RF excitation pulse stream into not less than two separate and sequentially deliverable RF pulse flows, each of which can be individually conveyed and separately delivered in sequence via the a measurable number of independent transmission channels to one of said designated groupings of individual transmit RF coils in said RF array;

sequentially conveying each of said split RF pulse flows via the the measurable number of independent transmission channels to one of said designated groupings of individual transmit RF coils in said RF array for separate and concurrent transmissions of $B_1$ magnetic field bursts; and directing separate and concurrent transmissions of $B_1$ magnetic field bursts from each of said designated groupings of individual transmit RF coils in said RF array to a targeted living tissue, whereby the effective equivalent of a true simultaneous transmission of a $B_1$ magnetic field is achieved.

2. A method for generating an effective equivalent of a simultaneous transmission of excitation RF signals to a targeted living tissue disposed within a moderate to high strength magnetic field for magnetic resonance imaging, said method comprising the steps of:

accessing a MRI assembly able to produce electromagnetic waveforms as a RF excitation pulse stream on-demand using a plurality of independent transmission channels which are in operative communication with multiple individual transmit RF coils in a RF array for the conveyance of a RF excitation pulse stream, wherein the total number of independent transmission channels is measurably fewer than the total greater measurable number of individual transmit RF coils within said RF array;

dividing the total greater measurable number of individual transmit RF coils within said RF array of said MRI assembly into a plurality of designated groupings, wherein each of said designated groupings constitutes a determinable portion of the total measurable number of individual transmit RF coils within said RF array;

producing a RF excitation pulse stream within said MRI assembly for conveyance by the measurable number of independent transmission channels to the greater measurable number of individual transmit RF coils in said RF array;

splitting said produced RF excitation pulse stream into not less than two separate and sequentially deliverable RF pulse flows, each of which can be individually conveyed and separately delivered in sequence via the a measurable number of independent transmission channels to one of said designated groupings of individual transmit RF coils in said RF array; then altering said separate and sequentially deliverable split RF pulse flows such that at least one characteristic property of each altered split RF pulse flow becomes identifiably different, and whereby said alteration of at least one characteristic property is the consequential result of at least one action selected from the group consisting of (i) temporally concatenating the pulses of said split RF pulse flow, (ii) interdigitating the pulses of said split RF pulse flow, (iii) changing the timing sequence of the pulses in said split RF pulse flow, and (iv) changing the selectivity of the pulses in said split RF pulse flow; and sequentially conveying each of said split and altered RF pulse flows via the a measurable number of independent transmission channels to one of said designated groupings of individual transmit RF coils in said RF array for separate and concurrent transmissions of $B_1$ magnetic field bursts; and directing separate and concurrent transmissions of $B_1$ magnetic field bursts from each of said designated groupings of individual transmit RF coils in said RF array to a targeted living tissue, whereby an effective equivalent of a true simultaneous transmission of a $B_1$ magnetic field is achieved.

3. A method for generating an effective equivalent of a simultaneous transmission of excitation RF signals to a targeted living tissue disposed within a moderate to high strength magnetic field for magnetic resonance imaging, said method comprising the steps of:

accessing a MRI assembly able to produce electromagnetic waveforms as a RF excitation pulse stream on-demand using a plurality of independent transmission channels which are in operative communication with multiple individual transmit RF coils in a RF array for the conveyance of a RF excitation pulse stream, wherein the total number of independent transmission channels is measurably fewer than the total greater measurable number of individual transmit RF coils within said RF array;

dividing the total greater measurable number of individual transmit RF coils within said RF array of said MRI assembly into a plurality of designated groupings, wherein each of said designated groupings constitutes a determinable portion of the total measurable number of individual transmit RF coils within said RF array;

producing a RF excitation pulse stream within said MRI assembly for conveyance by a measurable number of independent transmission channels to the greater measurable number of individual transmit RF coils in said RF array;

altering said RF excitation pulse stream such that at least one characteristic property of said RF excitation pulse stream becomes identifiably different, and whereby said alteration of at least one characteristic property is the consequential result of at least one action selected from the group consisting of (i) temporally concatenating the pulses of said RF excitation pulse stream, (ii) interdigitating the pulses of said RF excitation pulse stream, (iii) changing the timing sequence of the pulses in said RF excitation pulse stream, and (iv) changing the selectivity of the pulses in said RF excitation pulse stream; then splitting said altered RF excitation pulse stream into not less than two separate and sequentially deliverable RF pulse flows, each of which can be individually conveyed and separately delivered in sequence via the a measurable number of independent transmission channels to one of said designated groupings of individual transmit RF coils in said RF array;

sequentially conveying each of said altered and split RF pulse flows via a measurable number of independent transmission channels to one of said designated groupings of individual transmit RF coils in said RF array for separate and concurrent transmissions of $B_1$ magnetic field bursts; and directing separate and concurrent transmissions of $B_1$ magnetic field bursts from each of said designated groupings of individual transmit RF coils in said RF array to a targeted living tissue, whereby an effective equivalent of a true simultaneous transmission of a $B_1$ magnetic field is achieved.

4. The method as recited in claim 1, 2, or 3 further comprising the steps of:

conveying one of said sequentially deliverable RF pulse flows via a measurable number of independent transmission channels to a first designated grouping of individual transmit RF coils for a transmission of a first set of $B_1$ magnetic field bursts; and rapidly conveying another of said sequentially deliverable RF pulse flows via the total number of independent transmission channels to at least a second designated grouping of individual transmit RF coils for a concurrent transmission of a second set of $B_1$ magnetic field bursts.

5. The method as recited by claim 1, 2, or 3 wherein each of the multiple transmit RF coils in each designated grouping of coils is prechosen as to its spatial location within the organizational disposition of said RF array.

6. The method as recited by claim 4 wherein the measurable number of individual transmit RF coils in each of said designated grouping is equal to the total measurable number of independent transmission channels then available for use within said accessible MRI assembly.

7. The method as recited by claim 4 wherein the measurable number of individual transmit RF coils in each of said designated grouping of coils is less than the total measurable number of independent transmission channels then available for use within said accessible MRI assembly.

8. The method as recited by claim 1 wherein said pulses of said RF pulse flows are temporally concatenated.

9. The method as recited by claim 1 wherein said pulses of said RF pulse flows are interdigitated.

10. The method as recited by claim 1 wherein the waveforms of said RF pulses of said RF pulse flows are frequency non-selective.

11. The method as recited by claim 1 wherein the waveforms of said pulses of said RF pulse flows are frequency selective.

12. In a conventional MRI assembly having ($\alpha$) an RF array for producing electromagnetic waveforms as a RF excitation pulse stream on-demand using a plurality of independent transmission channels which are in operative communication with multiple individual transmit RF coils, and wherein ($\beta$) the total measurable number of independent transmission channels is fewer than the total greater measurable number of individual transmit RF coils within the RF array, and wherein ($\gamma$) the RF array is able to generate a $B_1$ magnetic field as a series of radiofrequency magnetic field bursts having predetermined spatial and temporal amplitude and phase characteristics, and wherein ($\delta$) the RF array is able to transmit the generated $B_1$ magnetic field bursts to a targeted living tissue then lying within a $B_0$ magnetic field having a strength not less than about 3T;

the assembly improvement comprising:

a RF array for the production and conveyance of a RF excitation pulse stream wherein the total greater measurable number of independent transmit RF coils within said RF array is divided into a plurality of designated groupings, each of said designated groupings constituting a determinable portion of the total measurable number of individual transmit RF coils;

splitting means for cleaving a produced RF excitation pulse stream into not less than two separate and sequentially deliverable split RF pulse flows, each of which can be individually conveyed and separately delivered in sequence via a measurable number of independent transmission channels to one of said designated groupings of individual transmit RF coils in said RF array; and a rapid-speed routing switch able to direct and collectively convey in sequential series a plurality of split RF pulse flows from a measurable number of independent transmission channels to one of the designated groupings of individual transmit RF coils in the RF array for separate and concurrent transmissions of $B_1$ magnetic field bursts to a targeted living tissue.

13. The improved MRI assembly recited by claim 12 wherein said rapid-speed routing switch is comprised of PIN diodes and tuned circuit elements.

14. The improved MRI assembly recited by claim 12 wherein said rapid-speed routing switch is capable of sending individual streams of RF excitation pulses repeatedly to different individual transmit RF coils in rapid time-limited intervals ranging in duration from about $1 \times 10^{-6}$ second to about $50 \times 10^{-6}$ seconds.

15. The improved MRI assembly recited by claim 12 further comprising altering means operative for changing said split RF pulse flows such that at least one characteristic property of each split RF pulse flow becomes identifiably different.

\* \* \* \* \*